(12) United States Patent
Wang

(10) Patent No.: US 7,759,244 B2
(45) Date of Patent: Jul. 20, 2010

(54) METHOD FOR FABRICATING AN INDUCTOR STRUCTURE OR A DUAL DAMASCENE STRUCTURE

(75) Inventor: Jeng-Ho Wang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 25 days.

(21) Appl. No.: 11/747,214

(22) Filed: May 10, 2007

(65) Prior Publication Data

US 2008/0280436 A1 Nov. 13, 2008

(51) Int. Cl.
*H01L 21/4763* (2006.01)
*H01L 21/311* (2006.01)
*H01L 21/461* (2006.01)

(52) U.S. Cl. .............. 438/624; 438/696; 438/700; 438/740; 438/743; 438/744; 257/E21.022

(58) Field of Classification Search .............. 438/643, 438/696, 700–702, 740, 743–744, 634, 624; 257/E21.022
See application file for complete search history.

(56) References Cited

U.S. PATENT DOCUMENTS

| | | | | |
|---|---|---|---|---|
| 5,308,742 | A * | 5/1994 | Ta | 430/313 |
| 6,027,995 | A * | 2/2000 | Chiang et al. | 438/623 |
| 6,177,347 | B1 * | 1/2001 | Liu et al. | 438/675 |
| 2001/0044204 | A1 * | 11/2001 | Tang | 438/640 |
| 2002/0119672 | A1 * | 8/2002 | Wu et al. | 438/745 |
| 2003/0181034 | A1 * | 9/2003 | Jiang et al. | 438/638 |
| 2003/0224595 | A1 * | 12/2003 | Smith et al. | 438/637 |
| 2004/0067658 | A1 * | 4/2004 | Ko et al. | 438/778 |
| 2004/0246647 | A1 * | 12/2004 | Schindler | 361/147 |
| 2006/0089003 | A1 * | 4/2006 | Cheng et al. | 438/706 |
| 2006/0199370 | A1 * | 9/2006 | Dai et al. | 438/624 |
| 2007/0093071 | A1 * | 4/2007 | Verhaverbeke et al. | 438/724 |
| 2007/0117371 | A1 * | 5/2007 | Engbrecht et al. | 438/622 |
| 2007/0148966 | A1 * | 6/2007 | Baks et al. | 438/638 |
| 2007/0190718 | A1 * | 8/2007 | Coolbaugh et al. | 438/253 |
| 2007/0243714 | A1 * | 10/2007 | Shin et al. | 438/706 |
| 2008/0020581 | A1 * | 1/2008 | Liu | 438/706 |
| 2008/0102621 | A1 * | 5/2008 | Yoon et al. | 438/618 |
| 2008/0132067 | A1 * | 6/2008 | Ma | 438/674 |
| 2008/0157217 | A1 * | 7/2008 | Burke et al. | 257/379 |
| 2008/0182402 | A1 * | 7/2008 | Li et al. | 438/618 |

* cited by examiner

*Primary Examiner*—Hsien-ming Lee
*Assistant Examiner*—Kevin Parendo
(74) *Attorney, Agent, or Firm*—Winston Hsu

(57) ABSTRACT

A method for fabricating an inductor structure or a dual damascene structure includes following steps. First, a dielectric layer is provided. Subsequently, a first etching process is performed on the dielectric layer so as to form a first opening in the dielectric layer. A polymer is also formed in the first opening during the first etching process. Next, a polymer-removing step is performed to remove the polymer. Thereafter, a second etching process is performed on the dielectric layer to form a second opening in the dielectric layer. Furthermore, the first opening and the second opening are filled with a conductive material so as to form an inductor structure or a dual damascene structure.

14 Claims, 34 Drawing Sheets

METHOD FOR FABRICATING AN INDUCTOR STRUCTURE OR A DUAL DAMASCENE STRUCTURE

BACKGROUND OF THE INVENTION

1. Field of the Invention

The present invention relates to a method for fabricating an inductor structure or a dual damascene structure, and more particularly, to a method for fabricating an inductor structure or a dual damascene structure by means of a polymer-removing step.

2. Description of the Prior Art

Inductors built in semiconductor wafers are widely used in CMOS based radio frequency circuits, such as low-noise amplifiers, voltage-controlled oscillators, and power amplifiers. Generally speaking, the inductor is usually a spiral conductor in top view of the semiconductor wafer, where the conductor fills a spiral trench formed in a dielectric layer of the semiconductor wafer.

Please refer to FIGS. 1-6. FIGS. 1-6 are schematic cross-sectional diagrams illustrating a method for forming an inductor structure in a semiconductor wafer 10 according to the prior art. Since an inductor is usually a spiral conductor in top view of the semiconductor wafer, it is to be understood by a person skilled in this art that FIGS. 1-6 only show parts of the inductor structure, and the other parts of the inductor structure can be formed simultaneously. As shown in FIG. 1, a semiconductor wafer 10 is provided first. The semiconductor wafer 10 includes a substrate 12, a barrier layer 14 covering the substrate 12, a dielectric layer 16 located on the barrier layer 14, and a patterned barrier layer 18 positioned on the dielectric layer 16.

The substrate 12 includes three dielectric layers 22, 24, 26 positioned from bottom to top, a barrier layer 32 located between the dielectric layer 22 and the dielectric layer 24, a barrier layer 34 located between the dielectric layer 24 and the dielectric layer 26, an interconnect structure 36 positioned in the dielectric layer 22, and an interconnect structure 38 positioned in the dielectric layers 24 and 26. The interconnect structures 36 and 38 are formed for electrically connecting to the follow-up inductor structure and other components in the semiconductor wafer 10. The barrier layers 14, 18, 32, 34 can include silicon oxynitride (SiON) layers or silicon nitride (SiN) layers. The patterned barrier layer 18 is formed by means of a lithographic and etching process for defining a via hole pattern of the inductor structure. As known by those skilled in this art, parts of the dielectric layer 16 located under the opening of the patterned barrier layer 18 may be etched by the above-mentioned lithographic and etching process.

After that, as shown in FIG. 2, a deposition process is performed to form a dielectric layer 42 on the surface of the semiconductor wafer 10. The opening of the patterned barrier layer 18 and the recess of the dielectric layer 16 are filled with the dielectric layer 42. A patterned mask 44 is thereafter formed on the dielectric layer 42 to define an inductor trench pattern of the inductor structure.

As shown in FIG. 3, an etching process is performed to remove a portion of the dielectric layer 42 through the opening of the patterned mask 44 until the surface of the barrier layer 14 is exposed so as to form an inductor pattern opening 54 of the inductor structure. In this etching process, the barrier layer 14 functions as an etching stop layer. The inductor pattern opening 54 of the inductor structure includes an inductor trench 56 and two via holes 58. The inductor trench 56 has a spiral shape in top view of the semiconductor wafer 10, and the via holes 58 connect the inductor trench 56 with the interconnect structures 36, 38 below. It should be noted that FIGS. 1-6 only show parts of the inductor trench 56, and one of the via holes 58. As mentioned above, the other parts of the inductor structure can be formed simultaneously.

However, the thicker inductor film thickness is required for the quality factor (Q) improvement such that the higher selectivity of the etching gases are needed to achieve. Thus, the residues, such as polymers 52, are easily formed on the sidewall and on the bottom of the inductor trench 56 and of the via holes 58 during the etching process, where the polymers 52 usually comprise high-molecule polymers with carbon, silicon, nitrogen, fluorine, titanium, or other impurities. The polymers 52 covering the sidewall of the inductor trench 56 and the via holes 58 influence the pattern define and the quality of inductor structure.

As shown in FIG. 4, a cleaning process is next carried out to remove the polymers 52. In order to remove the polymers 52, a liquid solvent having high cost has to be used in the prior art method. After the polymers 52 are removed by the high-cost liquid solvent, an etching process is performed to etch the barrier layer 14 so as to expose the interconnect structure 38.

As shown in FIG. 5, a barrier layer 62 can be deposited on the surface of the inductor pattern opening 54 for preventing the copper migration from the interconnect layer to the other parts of the semiconductor wafer 10. The barrier layer 62 can be made from tantalum (Ta), tantalum nitride (TaN), titanium nitride (TiN), titanium (Ti) or metal materials with high melting points. Afterward, a physical vapor deposition (PVD) process is performed to form a thin seed layer (not shown in the figures) on the surface of the barrier layer 62.

Subsequently, as shown in FIG. 6, a copper layer is thereafter formed to fill the inductor pattern opening 54. The filling copper layer in the inductor pattern opening 54 becomes an inductor structure 64, and the inductor structure 64 is electrically connected to the interconnect structure 38 below.

Polymers 52 are easily formed on the inductor pattern opening 54 during the etching process of forming the inductor pattern opening 54. However, when the etching process of forming the inductor pattern opening 54 is performed, the polymers 52 are obstructions and retardations that elongate the process. Especially, in order to promote the quality factors (Q) of inductors, inductor trenches having high aspect ratios are applied to the manufacturing process of inductors, and the etching time will be extremely elongated by these polymers 52.

On the other hand, since the polymers 52 are hardly etched by the etching process of forming the inductor pattern opening 54, the exposed area of the inductor pattern opening 54 is rough and uneven. The inductor pattern opening 54 may even be deformed due to the terminal effect caused by the polymers 52. Accordingly, the following-formed inductor structure 64 has unfavorable structure, and the quality factors of the inductor structure 64 decreases.

In addition, the above-mentioned polymers have to be cleaned through using high-cost solvent and elongated etching time. Since the costs of solvent or chemical materials and the amounts of the wafer through are generally the key contributors of the semiconductor process cost, how to improve the method of fabricating the inductor structure 64 to reduce process cost is still an important issue.

SUMMARY OF THE INVENTION

It is therefore a primary objective of the present invention to provide a method for fabricating an inductor structure or a dual damascene structure to overcome the aforementioned problems.

According to the present invention, a method for fabricating an inductor structure is disclosed. First, a semiconductor wafer is provided. The semiconductor wafer comprises a substrate, a first dielectric layer positioned on the substrate, an etching stop layer positioned on the first dielectric layer, and a second dielectric layer positioned on the etching stop layer. The etching stop layer has at least an opening that defines a via hole pattern. Subsequently, a first etching process is performed on the second dielectric layer until exposing the etching stop layer so as to form an inductor trench in the second dielectric layer. The inductor trench overlaps the opening of the etching stop layer. Next, a polymer-removing step is performed to remove a polymer formed in the inductor trench. Furthermore, a second etching process is performed on the first dielectric layer until exposing the substrate so as to form at least a via hole in the first dielectric layer. Thereafter, the inductor trench and the via hole is filled with a conductive material so as to form an inductor structure.

From one aspect of the present invention, a method for fabricating a dual damascene structure is disclosed. First, a dielectric layer is provided. Subsequently, a first etching process is performed on the dielectric layer so as to form a first opening in the dielectric layer. A polymer is also formed in the first opening during the first etching process. Next, a polymer-removing step is performed to remove the polymer. Thereafter, a second etching process is performed on the dielectric layer to form a second opening in the dielectric layer. Furthermore, the first opening and the second opening are filled with a conductive material so as to form an inductor structure or a dual damascene structure.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to a method for fabricating an inductor structure or a dual damascene structure. It can be applied for the devices, such as mixed-signal circuits, radio frequency circuits, low-noise amplifiers, voltage-controlled oscillators, or power amplifiers.

Figure 12:
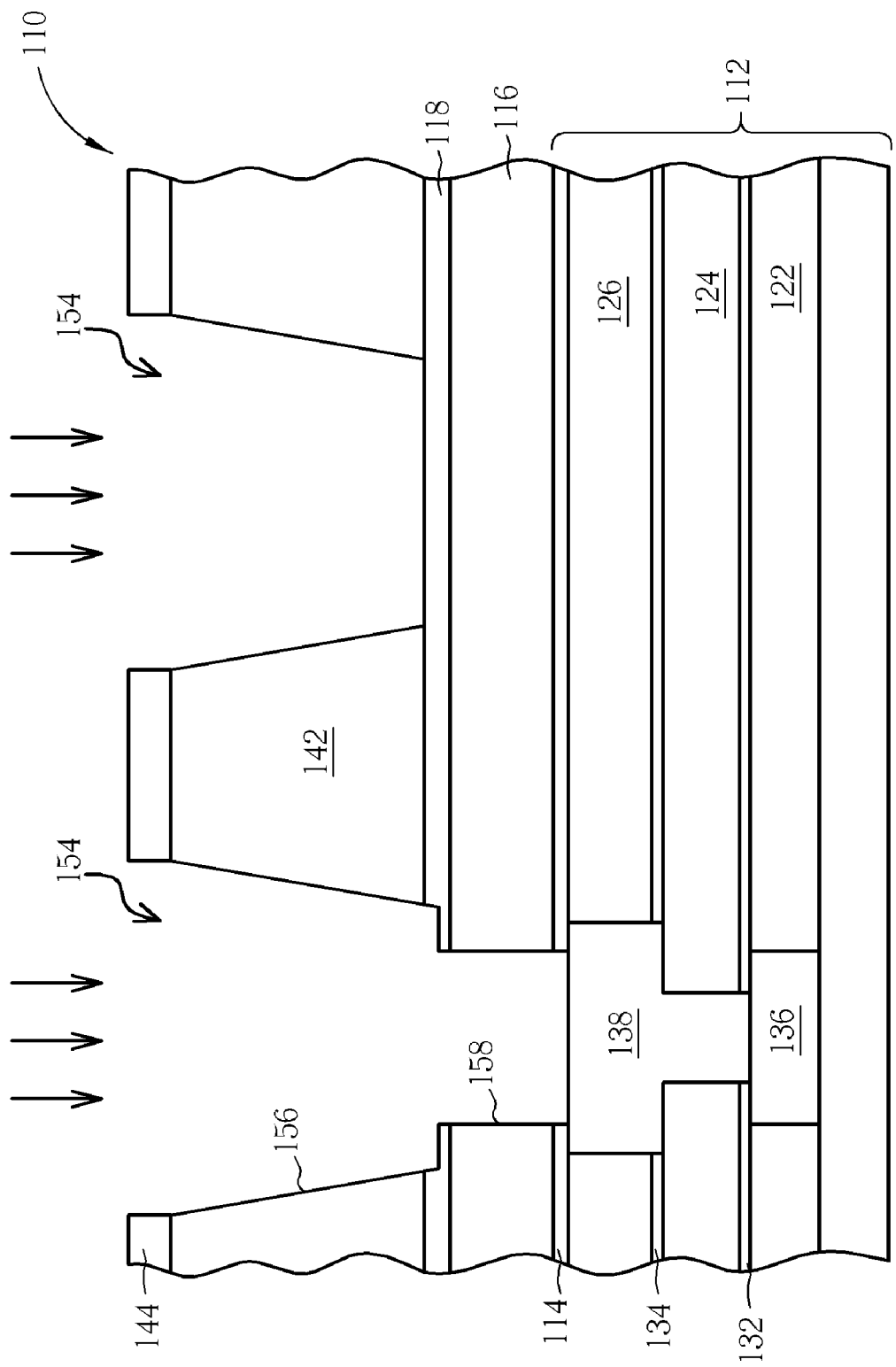
Figure 13:
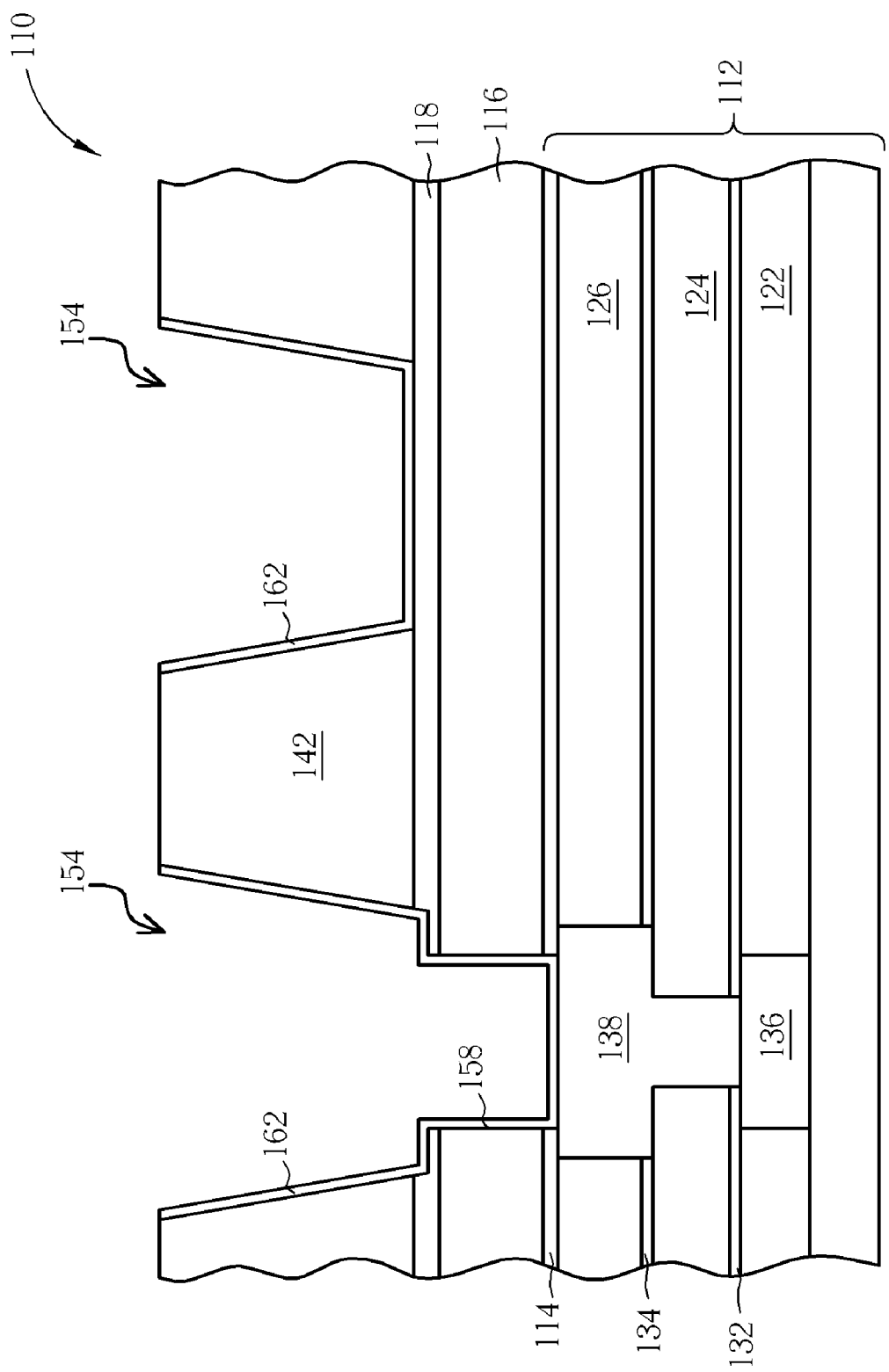
Figure 14:
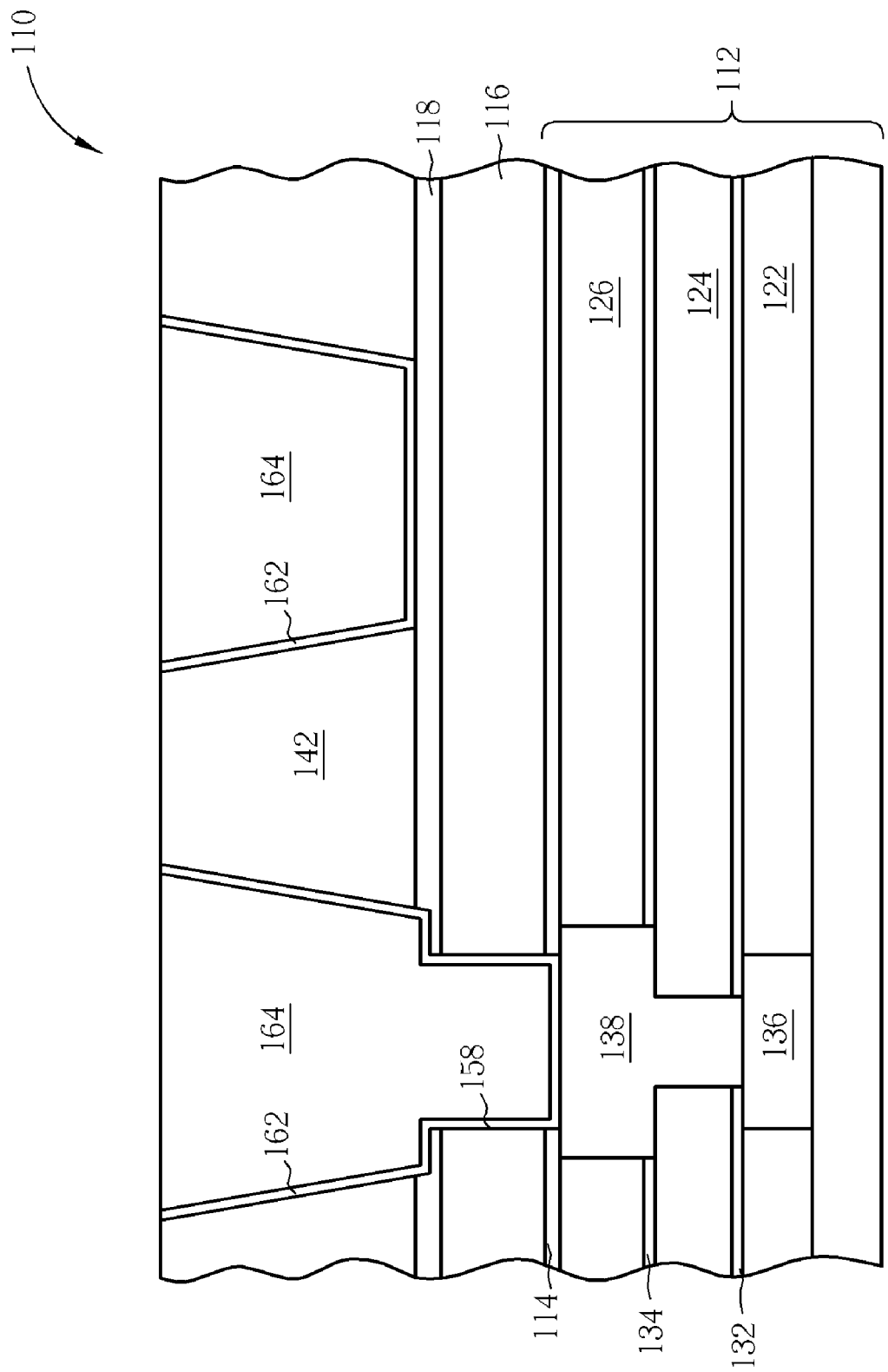
Figure 15:
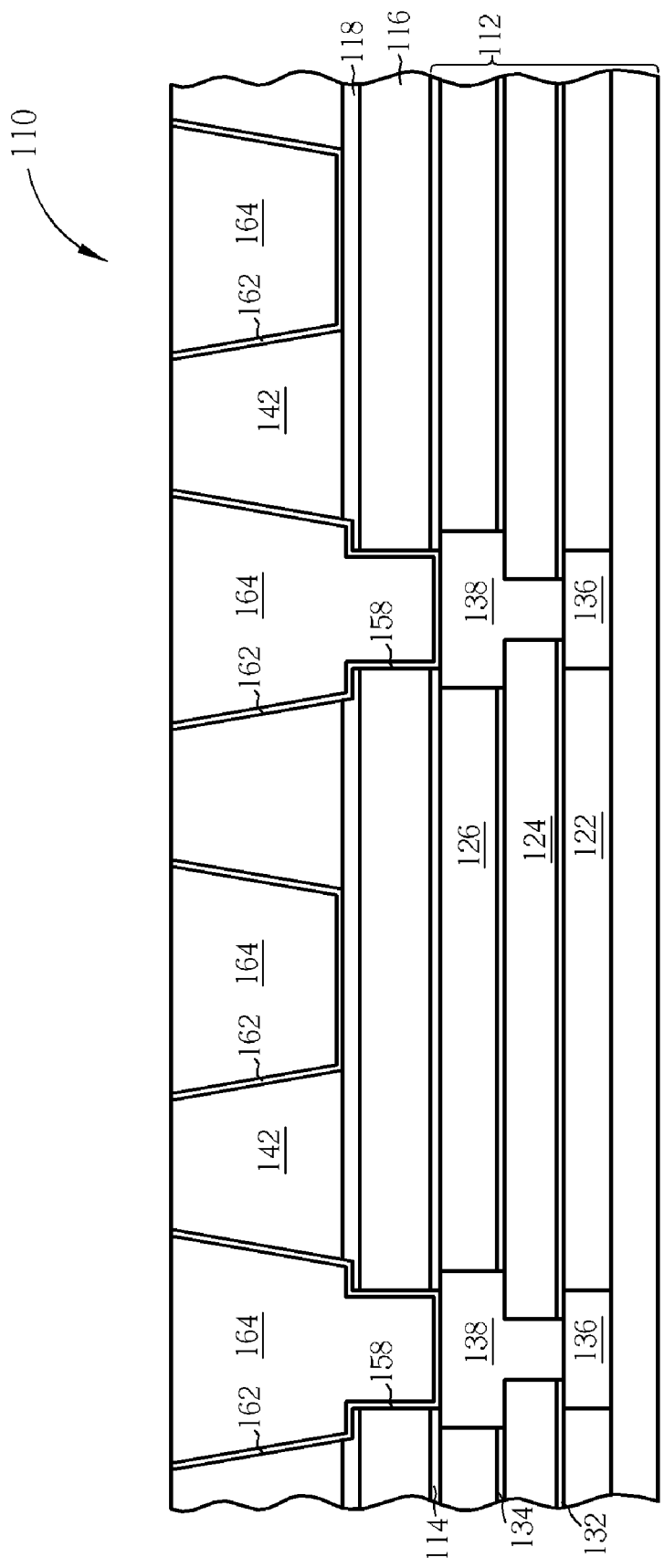
FIG. 15 is a schematic cross-sectional diagram illustrating the whole inductor structure that is shown in FIG. 14.
Figure 16:
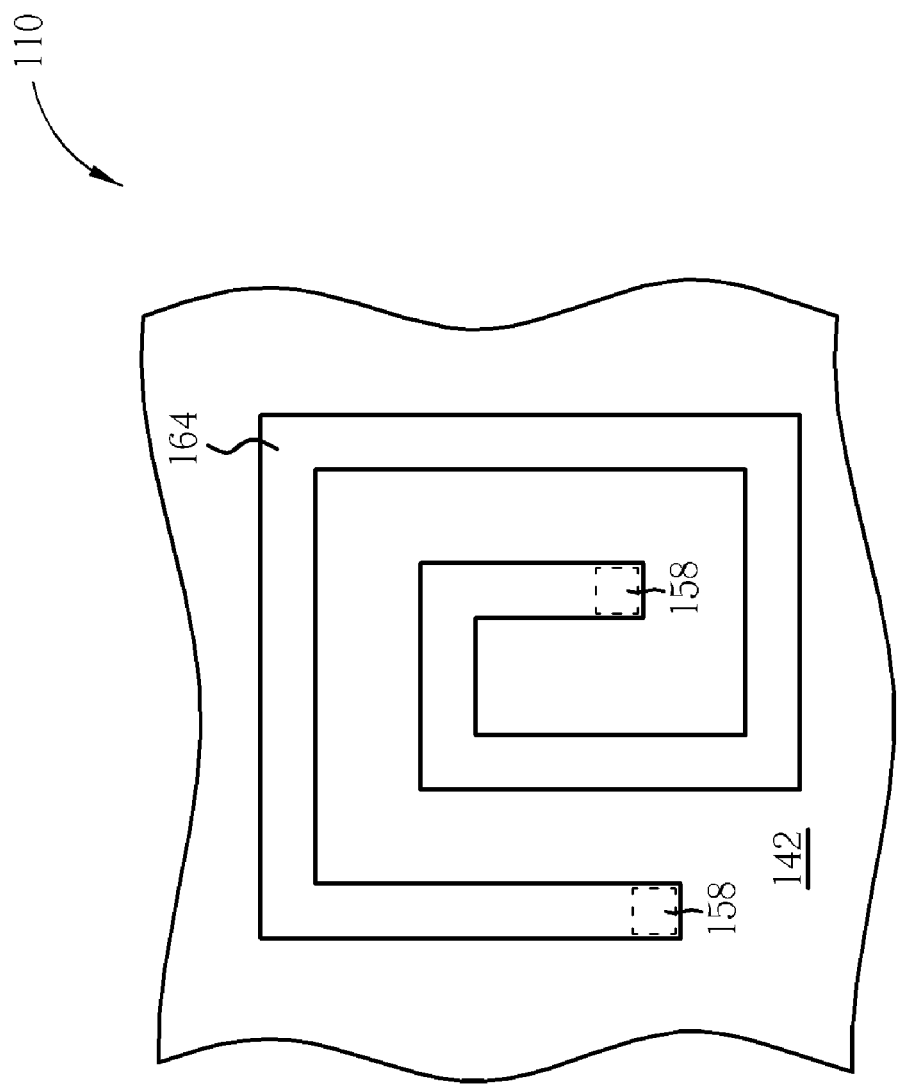
FIG. 16 is a schematic top view of the inductor structure shown in FIG. 15.

Please refer to FIGS. 7-16. FIGS. 7-14 are schematic cross-sectional diagrams illustrating a method for forming an inductor structure according to a first preferred embodiment of the present invention. FIG. 15 is a schematic cross-sectional diagram illustrating the whole inductor structure that is shown in FIG. 14, and FIG. 16 is a schematic top view of the inductor structure shown in FIG. 15, where the inductor structure of the present invention can include a dual damascene structure. The inductor is a spiral conductor in top view of the semiconductor wafer, so it is to be understood by a person skilled in this art that FIGS. 7-14 only show parts of the inductor structure, and the other parts of the inductor structure can be formed simultaneously. It is to also be understood that the drawings are not drawn to scale, and serve only for illustration purposes. In addition, some lithographic and etching processes relating to the present invention method are well known in the art and thus not explicitly shown in the drawings.

Figure 1:
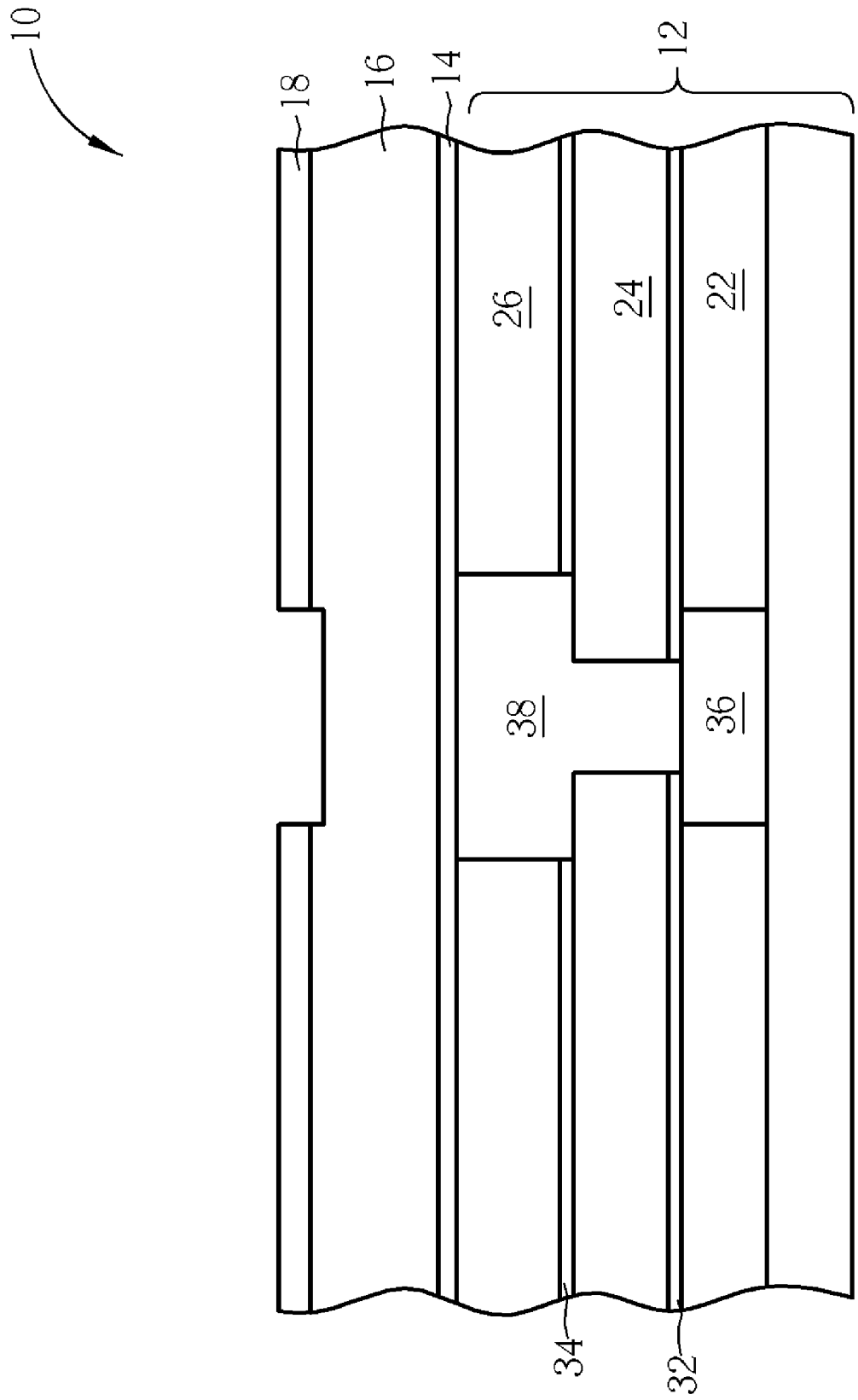
FIGS. 1-6 are schematic cross-sectional diagrams illustrating a method for forming an inductor structure in a semiconductor wafer according to the prior art.
Figure 2:
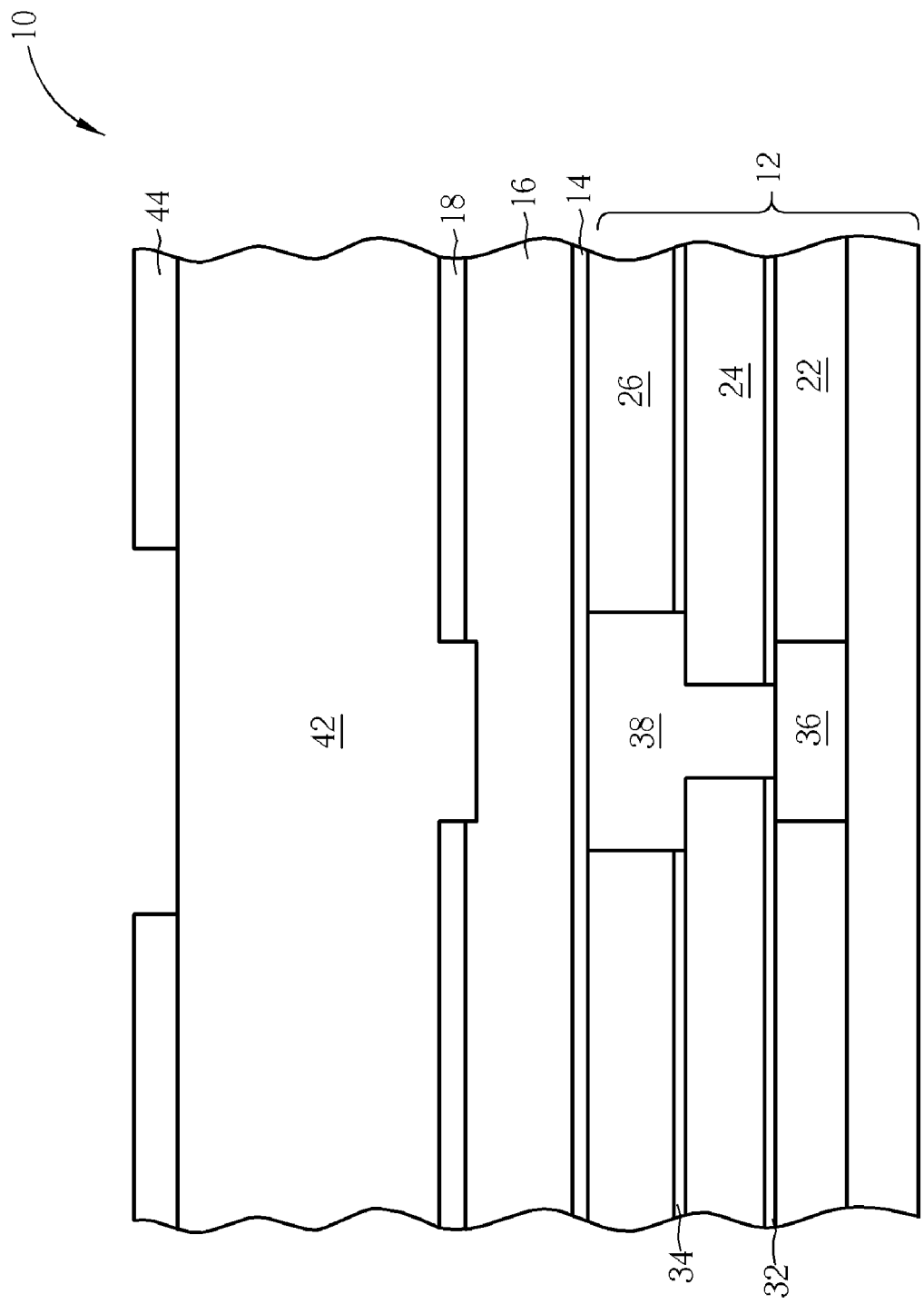
Figure 3:
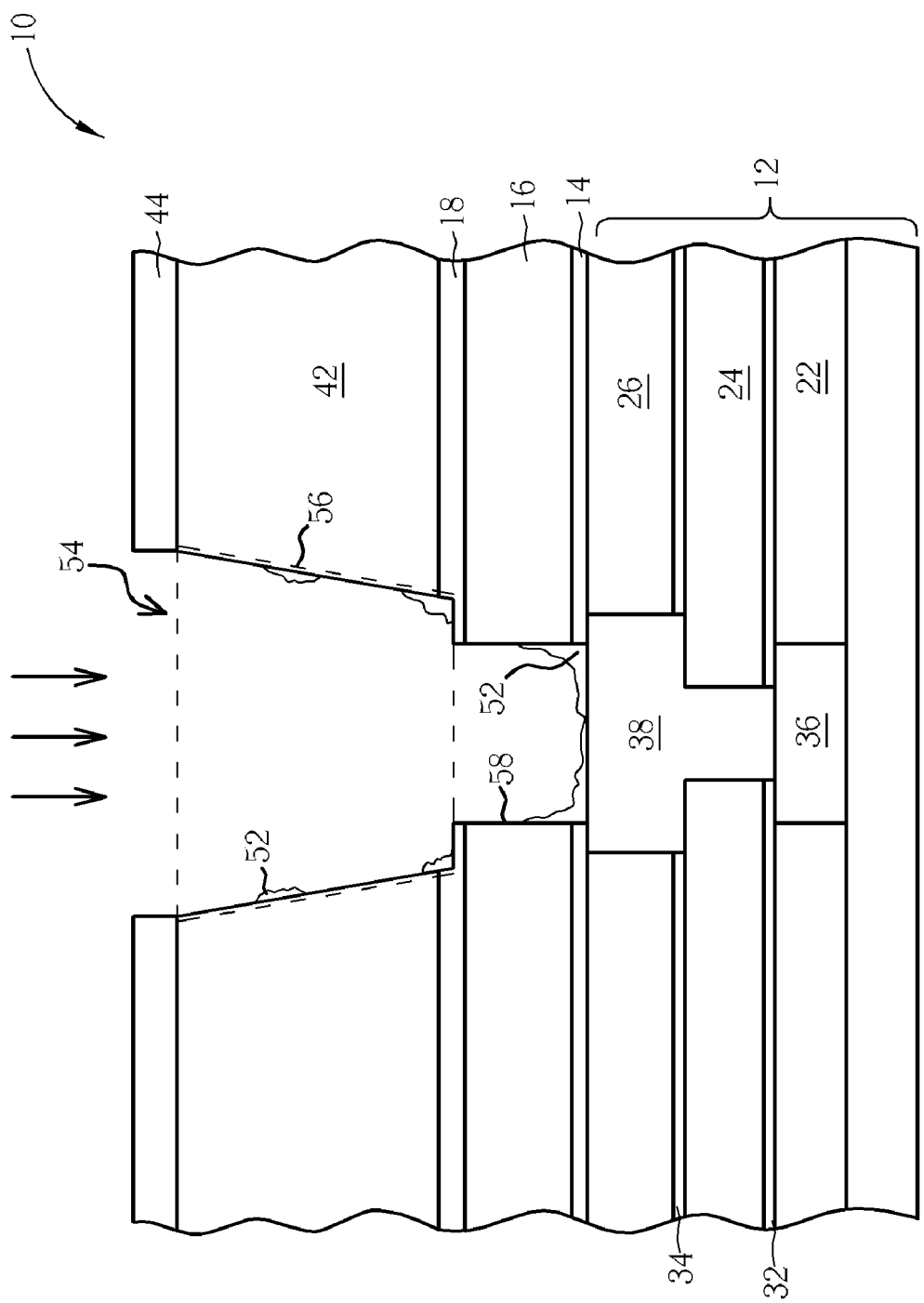
Figure 4:
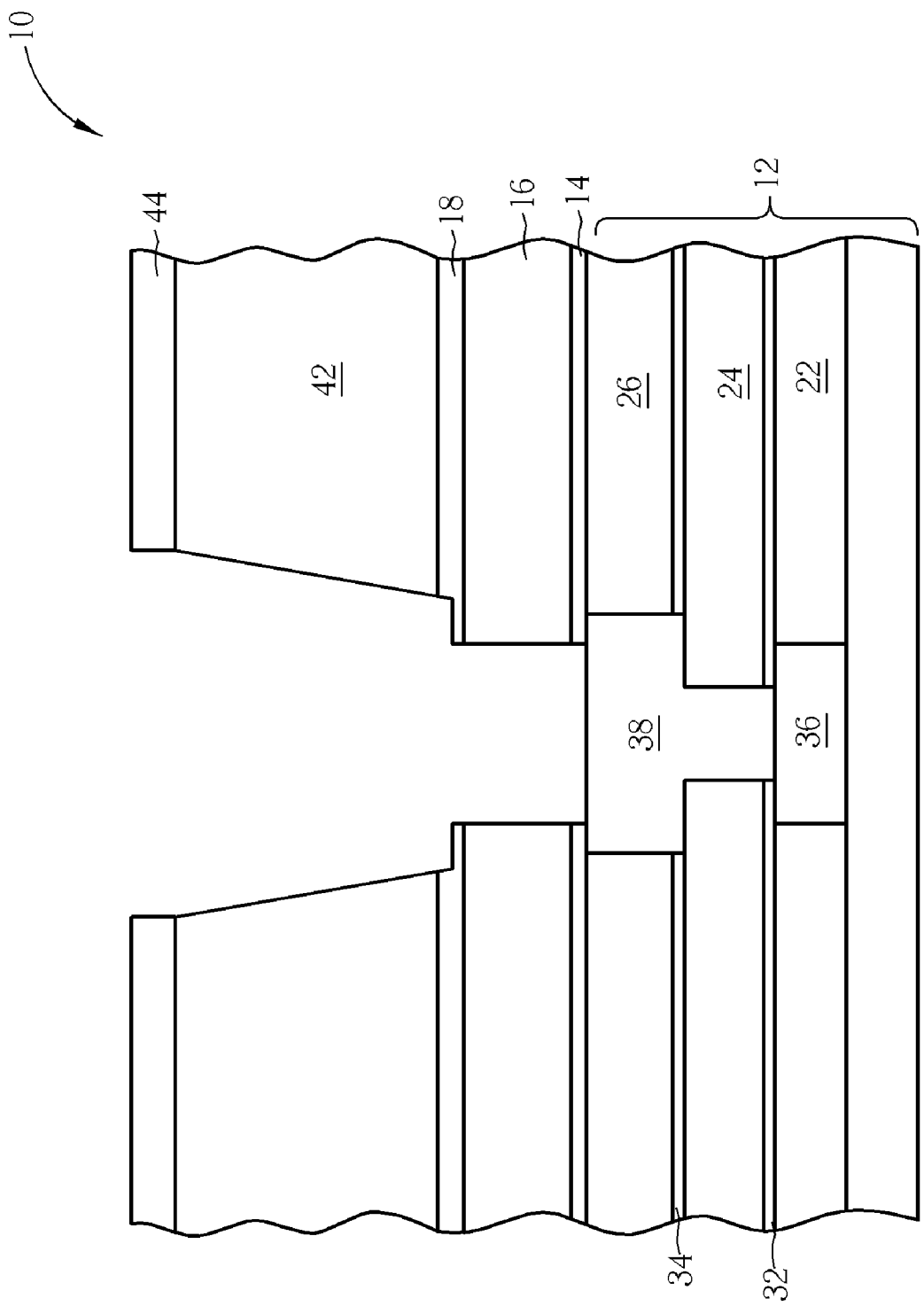
Figure 5:
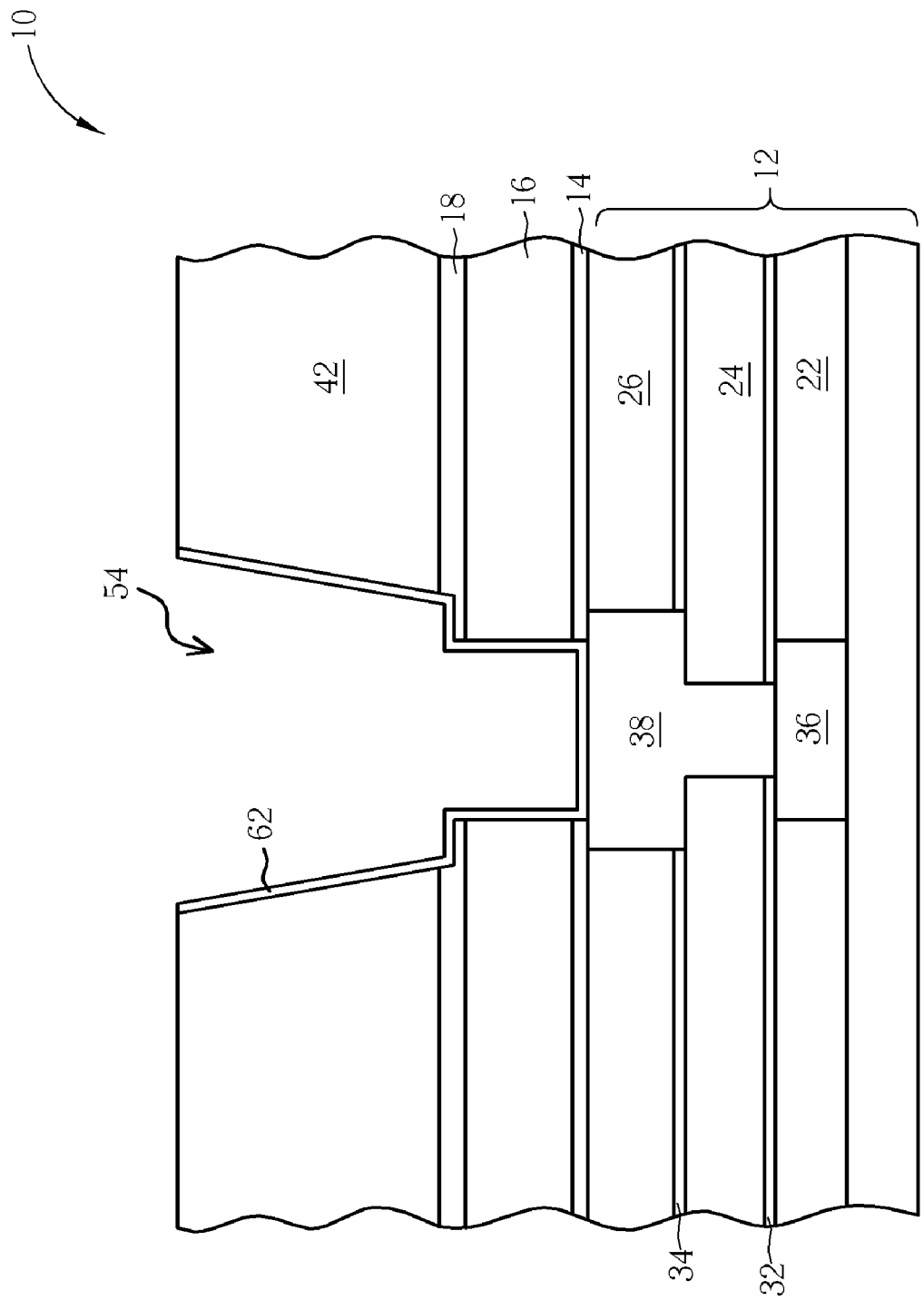
Figure 6:
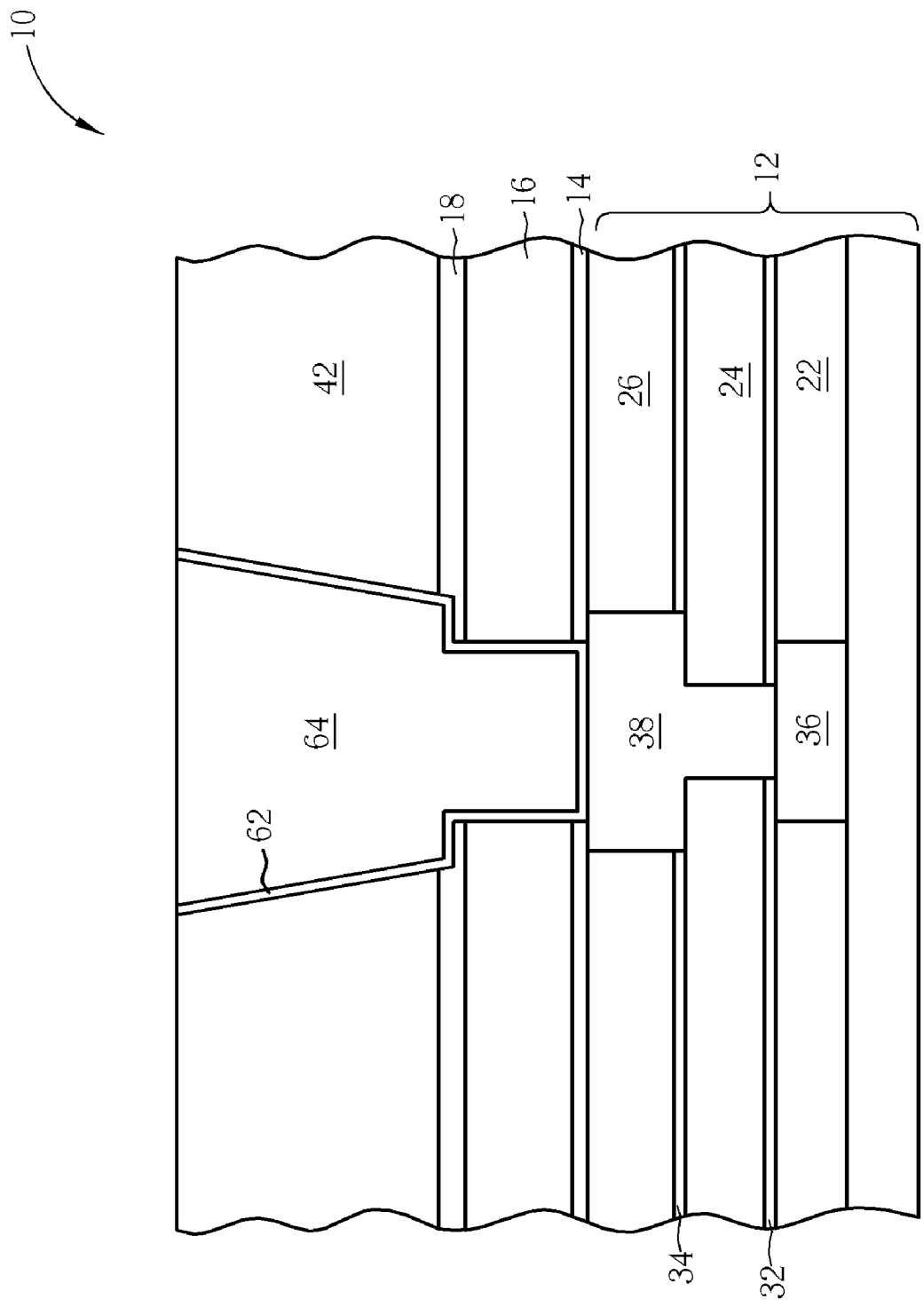
Figure 7:
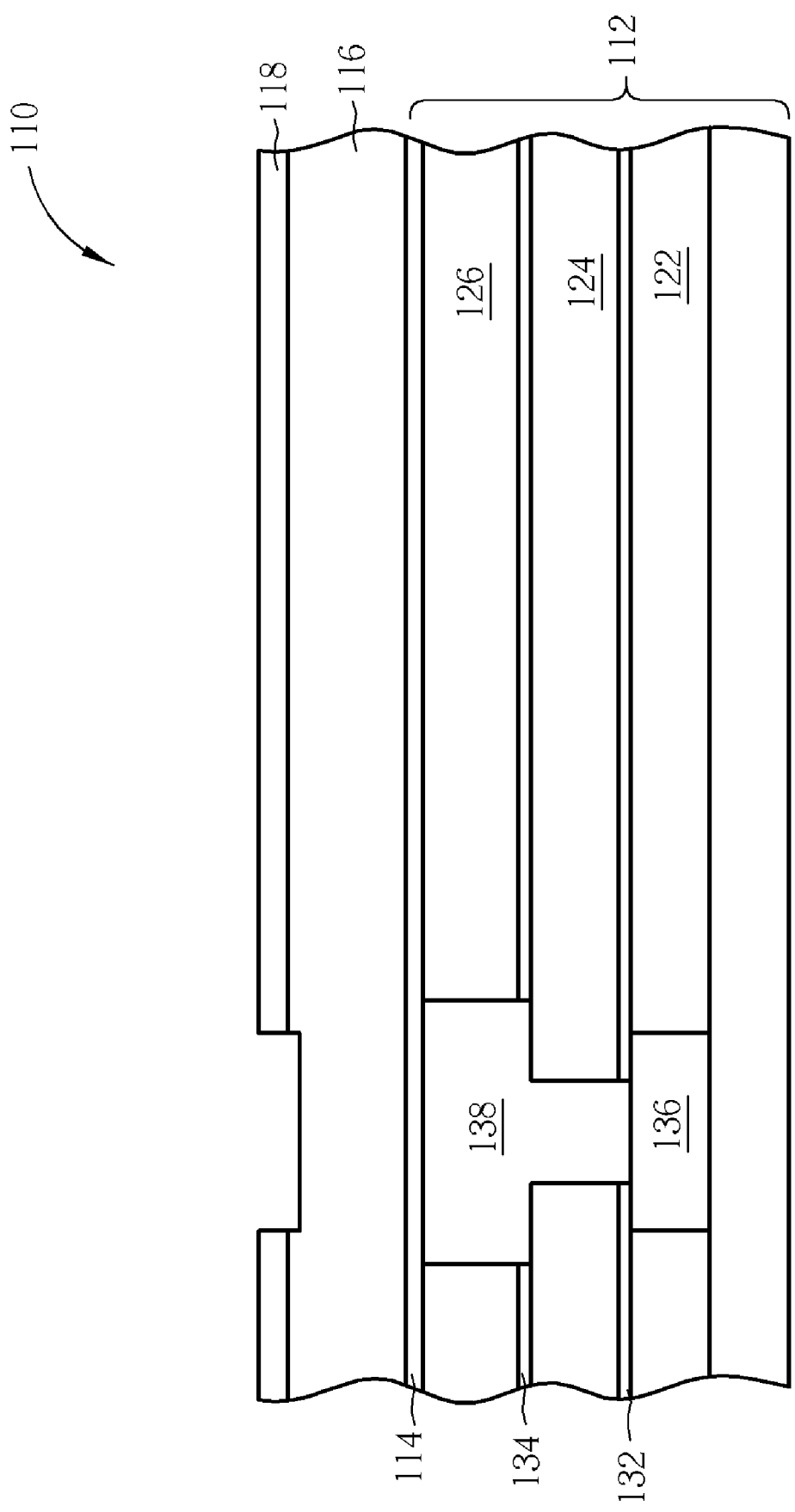
FIGS. 7-14 are schematic cross-sectional diagrams illustrating a method for forming an inductor structure according to a first preferred embodiment of the present invention.

As shown in FIG. 7, a semiconductor wafer 110 is provided first. The semiconductor wafer 110 includes a substrate 112, a first dielectric layer 116 covering the substrate 112, and an etching stop layer 118 positioned on the first dielectric layer 116. The substrate 112 may include a silicon substrate or a silicon-on-insulator (SOI) substrate, but is not limited thereto. The first dielectric layer 116 can contain lower dielectric constant (low-k) layer such as Si-containing low-k layer including fluorinated silicate glass (FSG) or carbon-containing low-k layer including carbon-doped oxide (CDO), and the etching stop layer 118 can be a Si-containing layer including silicon oxynitride (SiON) or carbide (SiC) or nitrogen incorporating carbide layer in this embodiment. In other embodiments, the dielectric layers in the present invention, such as the first dielectric layer 116, can contain any kind of insulating materials, such as undoped silicate glass (USG), phosphosilicate glass (PSG), borophosposilicate glass (BPSG), and the etching stop layer 118 may include a silicon nitride layer, a silicon carbide layer, a silicon nitride layer containing carbon, an oxide layer or a silicon layer. The etching stop layer 118 is thereafter patterned by means of a lithographic and etching process so that the etching stop layer 118 has at least an opening, which defines a via hole pattern of the inductor structure. As known by those skilled in this art, parts of the first dielectric layer 116 located under the opening of the etching stop layer 118 may also be etched by the above-mentioned lithographic and etching process. In other embodiments, the etching process may just stop when the surface of the first dielectric layer 116 is exposed so that the first dielectric layer 116 has no recess under the opening of the etching stop layer 118.

The substrate 112 includes a dielectric layer 122, a barrier layer 132 located on the dielectric layer 122, a dielectric layer 124 positioned on the barrier layer 132, a barrier layer 134 covering the dielectric layer 124, a dielectric layer 126 positioned on the barrier layer 134, and a barrier layer 114 covering the dielectric layer 126. In addition, the substrate 112 can further contain an interconnect structure 136 positioned in the dielectric layer 122, and an interconnect structure 138 positioned in the dielectric layers 124 and 126. The interconnect structures 136 and 138 are formed for electrically connecting to the follow-up inductor structure and other components in the semiconductor wafer 110. The barrier layers 114, 132, 134 can include Si-containing layer including silicon oxynitride layers, silicon nitride layers, oxide layers, silicon carbide layer, nitrogen incorporating silicon carbide layer, or silicon layers. It should be noted that the substrate 112 in FIG.

7 is just one example of the present invention, and the detail structure of the substrate 112 can be changed according to the product design.

Figure 8:
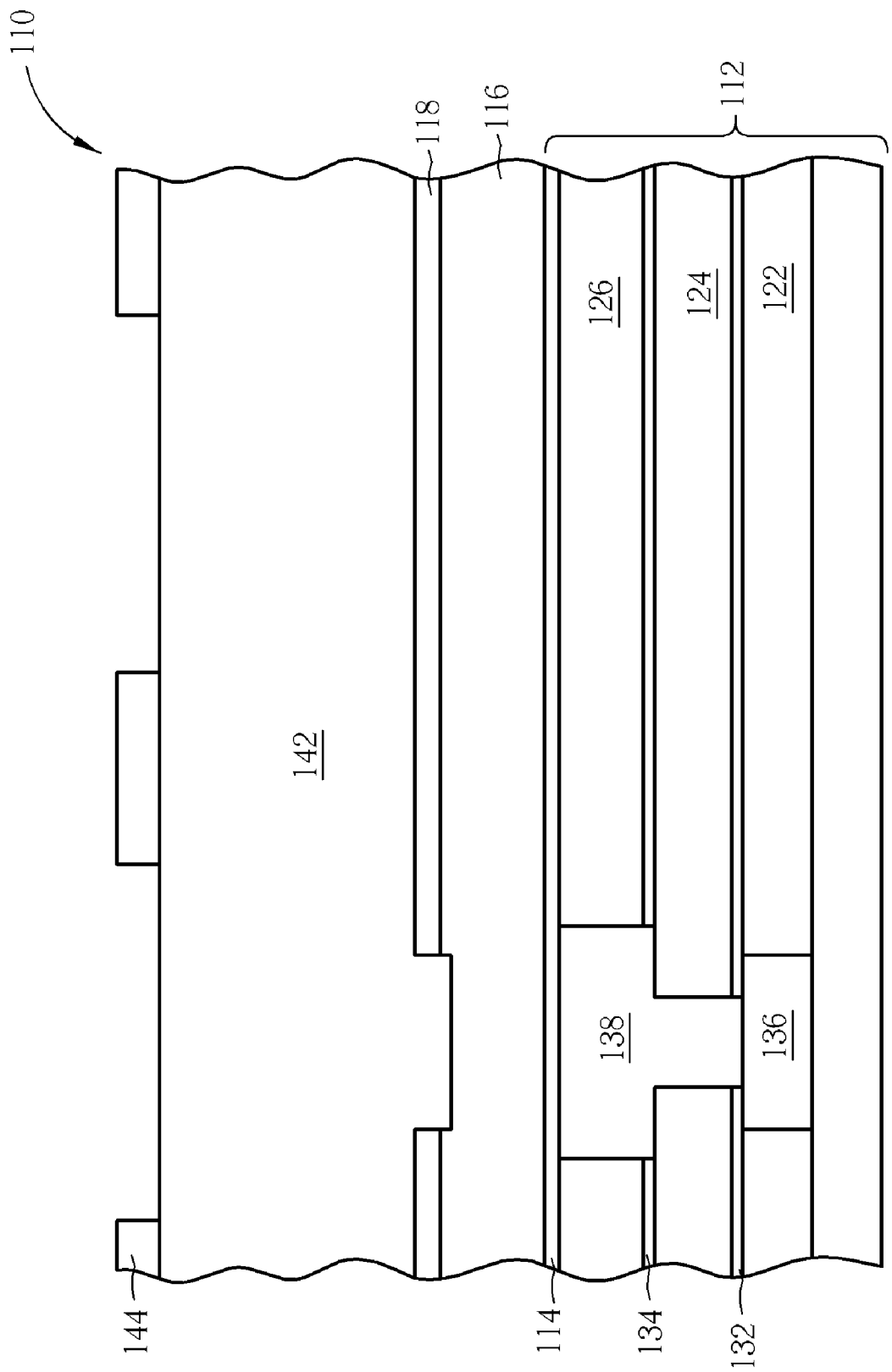

After that, as shown in FIG. 8, a deposition process is performed to form a second dielectric layer 142 on the surface of the semiconductor wafer 110. The opening of the etching stop layer 118 and the recess of the first dielectric layer 116 are filled with the second dielectric layer 142. The second dielectric layer 142 can contain silicon oxide, lower dielectric constant (low-k) layer such as Si-containing low-k layer including fluorinated silicate glass (FSG), or carbon-containing low-k layer including carbon-doped oxide (CDO), and thicker than the first dielectric layer 116. A patterned mask 144 is thereafter formed on the second dielectric layer 142 to define an inductor trench pattern of the inductor structure, where the inductor trench pattern can be a spiral layout pattern overlapping the opening of the etch stop layer 118 in top view. The patterned mask 144 is made from photoresist in this embodiment. The opening size of the patterned mask 144 is larger than the opening size of the etch stop layer 118. In the various embodiments, the patterned mask 144 can be made from any materials that have a high etching selectivity against the dielectric material. For example, the patterned mask 144 can be oxide, nitride or oxynitride.

Figure 9:
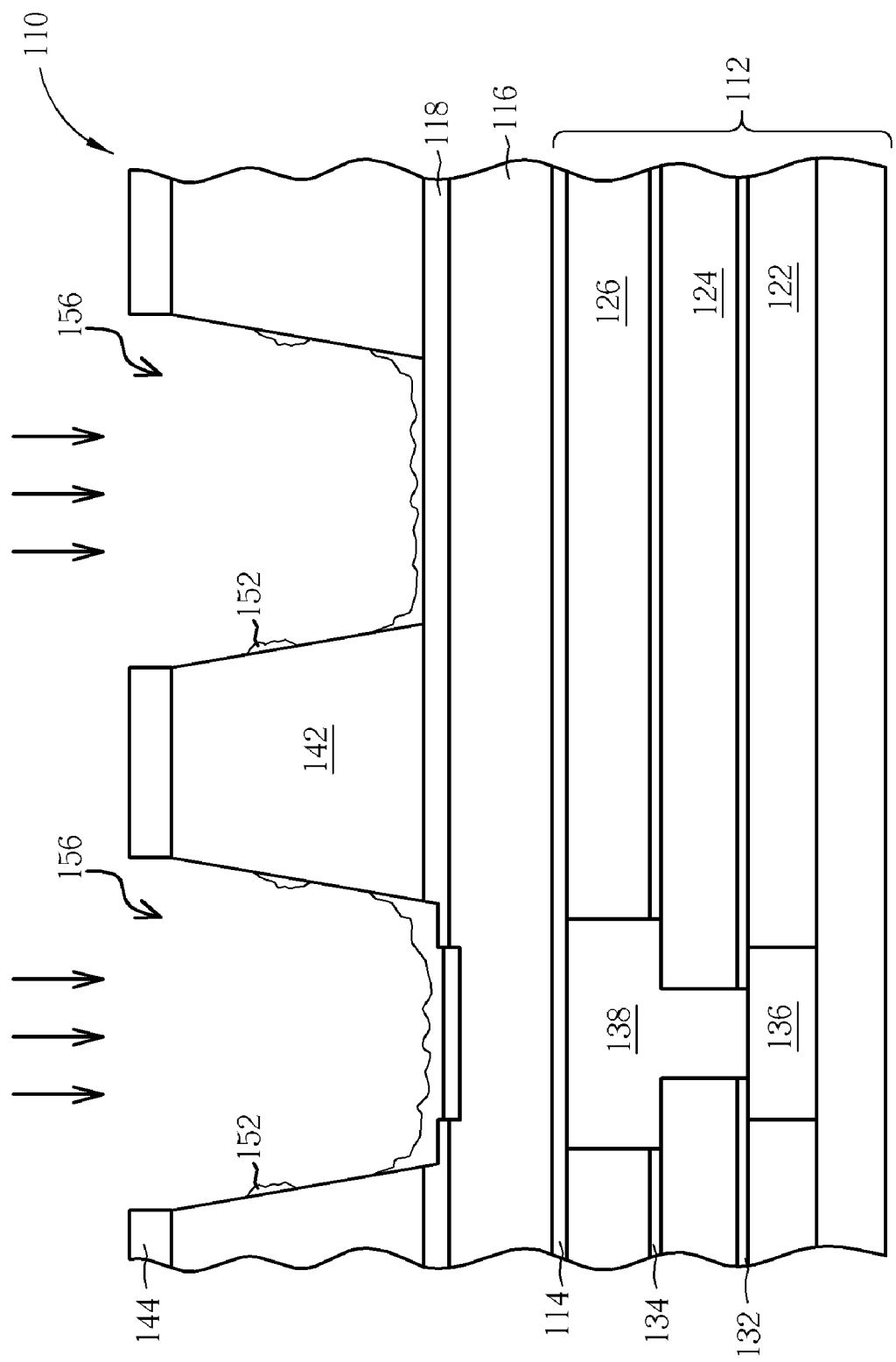

As shown in FIG. 9, a first etching process is next performed to remove a portion of the second dielectric layer 142 through the opening of the patterned mask 144 until the surface of the etching stop layer 118 is exposed so as to form an inductor trench 156 of the inductor structure in the second dielectric layer 142. The first etching process can contain oxygen ($O_2$) gas, argon (Ar) gas and fluorocarbon ($C_xF_y$) gas, such as octafluorocyclopentene ($C_5F_8$). For instance, the flowing rates of the oxygen gas, argon gas, and $C_5F_8$ gas can be 10 standard cubic centimeters per minute (sccm), 450 sccm, and 12 sccm, respectively. The inductor trench 156 overlaps the opening of the etching stop layer 118. The inductor trench 156 has a spiral shape in top view of the semiconductor wafer 110. As mentioned above, FIGS. 7-14 only show parts of the inductor structure, and the other parts of the inductor trench 156 can be formed simultaneously. During the first etching process, for the inductor pattern definition with the high aspect ratio concern, a polymer 152 is usually formed on the sidewall and on the bottom of the inductor trench 156. The polymer 152 may comprise high-molecule polymers with carbon, silicon, nitrogen, fluorine, titanium, or other impurities.

Figure 10:
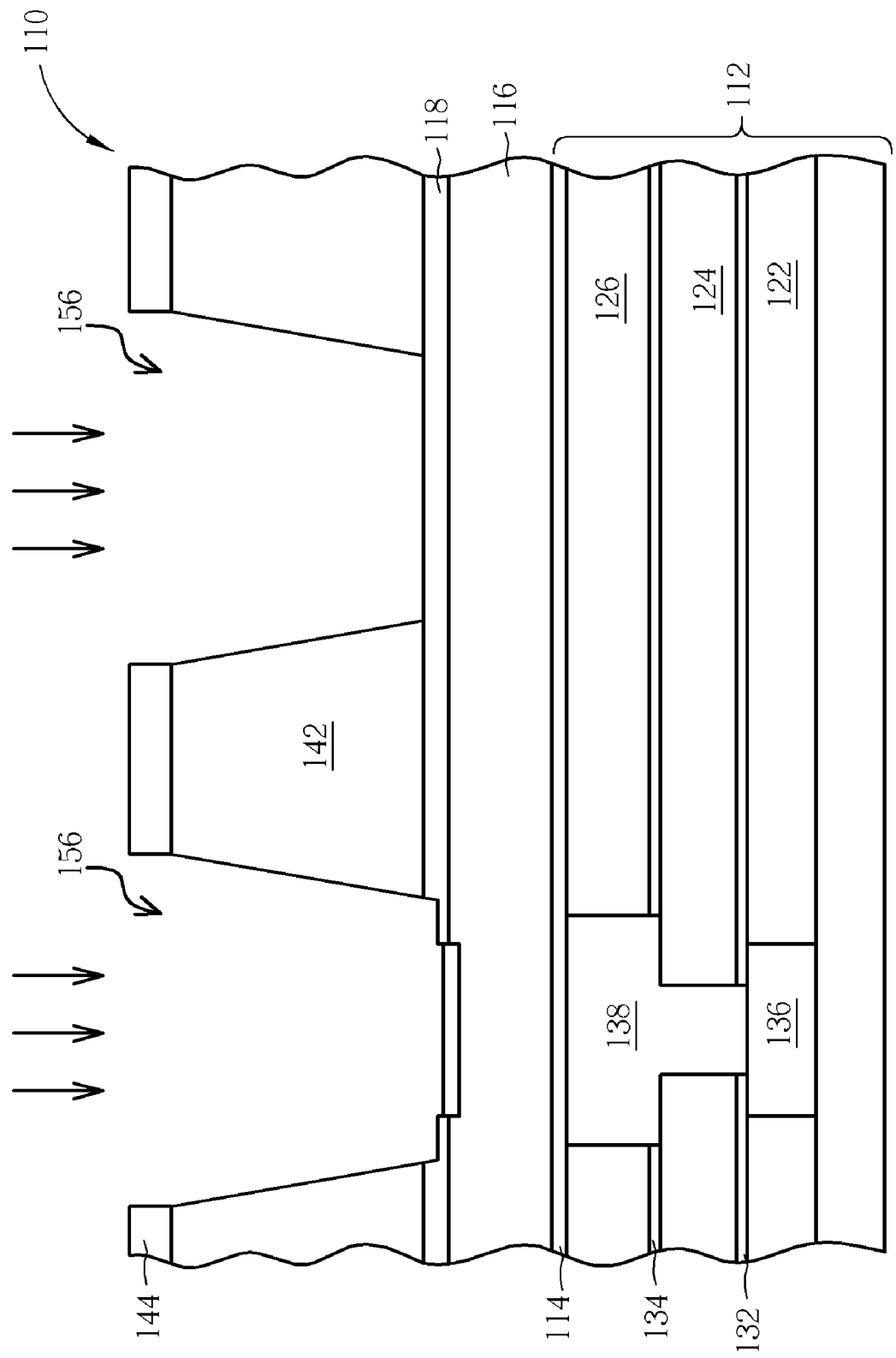

As shown in FIG. 10, a polymer-removing step is next carried out to remove the polymer 152 formed in the inductor trench 156. In this embodiment, the first etching process step and the polymer-removing step are both plasma etching processes performed in the same etch chamber. However, the reaction gases are changed. The polymer-removing step can include oxygen gas, argon gas and hydro-fluorocarbon ($CH_xF_y$) gas, such as trifluoromenthane ($CHF_3$). For instance, the flowing rates of the oxygen gas, argon gas, and $CHF_3$ gas can be 20 sccm, 100 sccm, and 20 sccm, respectively. By use of such etching gases composed of a mixture of argon gas, oxygen gas and CHF3 gas, the polymer 152 is easily and inexpensively removed without hurting the inductor trench 156 and the semiconductor wafer 110.

It should be noted that the polymer-removing step is carried out after the surface of the etching stop layer 118 is exposed by the first etching process in this embodiment. However, the present invention should not be limited to the embodiment. For instance, the first etching process can stop at a predetermined depth in the second dielectric layer 142 before the etching stop layer 118 is exposed, and the polymer-removing step is thereafter carried out.

The polymer-removing step may have a high ratio of fluorine atoms to carbon atoms (also called F/C ratio), and the polymer 152 is also stripped by the physical bombard in the chamber. In the various embodiments, the polymer-removing step can include trifluoromenthane gas, nitrogen gas, and hydrogen gas. Nitrogen gas can be applied instead of the oxygen gas, and hydrogen gas can be applied instead of the argon gas. In addition, the first etching process and the polymer-removing step can repeat periodically until the polymer 152 is removed.

Figure 11:
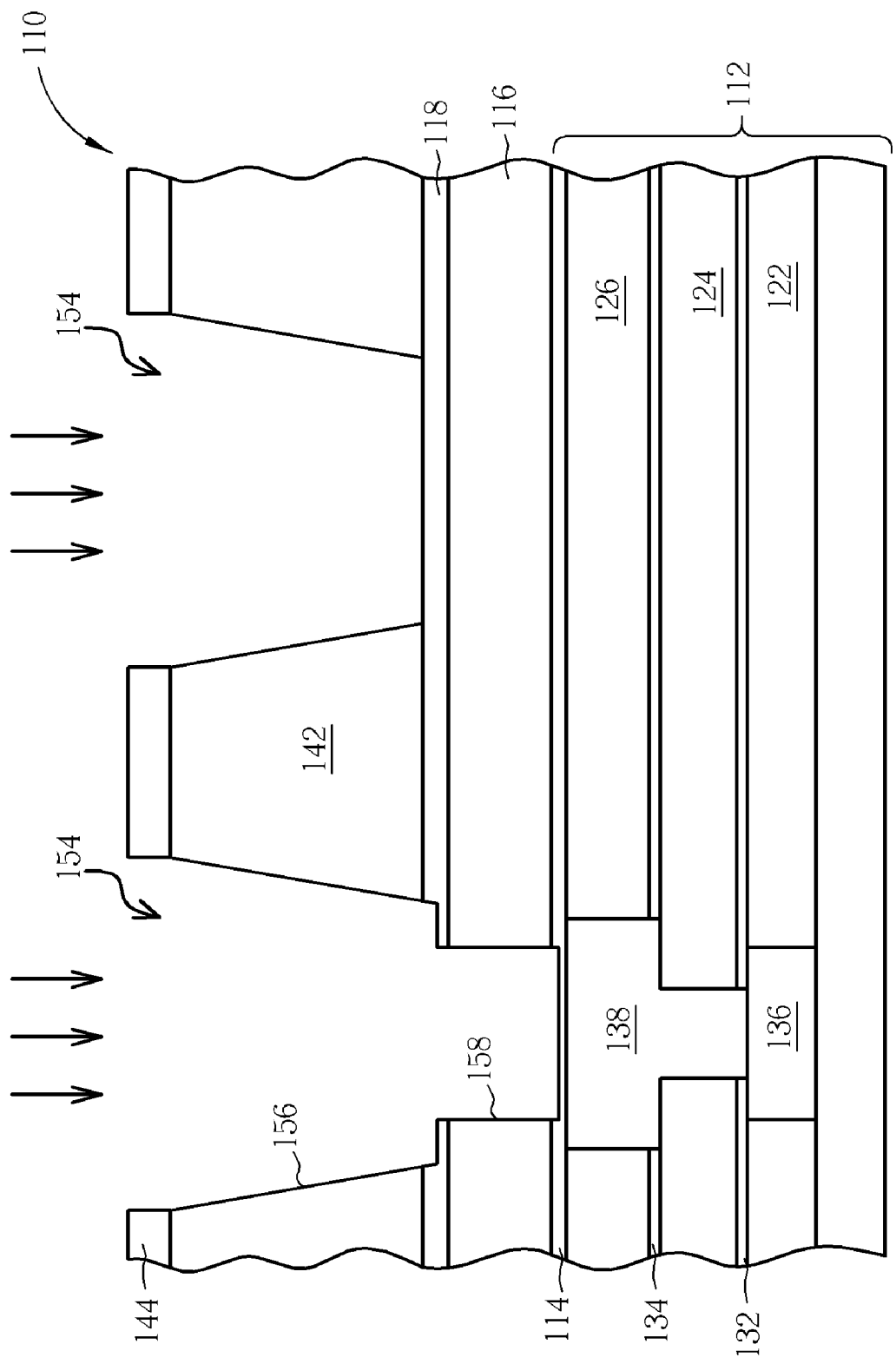

Afterward, as shown in FIG. 11, a second etching process is performed to remove a portion of the second dielectric layer 142 and a portion of the first dielectric layer 116 through the opening of the etching stop layer 118 until the surface of the barrier layer 114 is exposed so as to form at least a via hole 158 of the inductor structure in the first dielectric layer 116. The second etching process can contain oxygen gas, argon gas and fluorocarbon gas, such as $C_5F_8$ gas, where the flowing rates of the oxygen gas, argon gas, and $C_5F_8$ gas can be 10 sccm, 450 sccm, and 12 sccm, respectively. The second etching process can also be a plasma etching process performed in the same etch chamber with the first etching process or the polymer-removing step.

Since the first etching process is first performed until the surface of the etching stop layer 118 is exposed, the polymer 152 is subsequently removed by the polymer-removing step, and the second etching process is thereafter carried out, the present invention can make sure that the first etching process is finished properly, and the process of forming the inductor pattern opening 154 can have a nice etching stop window.

Furthermore, as shown in FIG. 12, a third etching process can be optionally performed to remove a portion of the barrier layer 114 until the surface of the interconnect structure 138 is exposed so that the via hole 158 can connect the inductor trench 156 with the interconnect structures 136 and 138 below. In other embodiments, the second etching process can be carried out until the surface of the interconnect structure 138 is exposed so that the third etching process can be omitted.

As shown in FIG. 13, a barrier layer 162 can be thereafter deposited on the surface of the inductor pattern opening 154 for preventing the following-formed copper migration from the interconnect layer to the other parts of the semiconductor wafer 110. The barrier layer 162 can be made from refractory or noble metal or compound including tantalum, tantalum nitride, titanium nitride, titanium or their combination. Afterward, a physical vapor deposition process can be performed to form a thin seed layer (not shown in the figures) on the surface of the barrier layer 162. It should be understood that any conductive materials filled in the inductor pattern opening 154 can function as an inductor, and the barrier layer 162 and the thin seed layer is not the key features for the present invention.

Next, as shown in FIG. 14, a conductive material is thereafter formed to fill the inductor pattern opening 154. The conductive material can be any material having a high conductivity including noble metal, such as copper, aluminum or other metals. The filling conductive material in the inductor pattern opening 154 becomes an inductor structure 164, and the inductor structure 164 is electrically connected to the interconnect structure 38 below.

As shown in FIG. 15 and FIG. 16, the whole appearance of the inductor structure 164 may have a spiral shape, where the terminals of the spiral can be electrically connected to different voltages. As mentioned above, FIGS. 7-14 only show parts of the inductor structure. In this embodiment, two via holes 158 are formed by the second etching process, so the inductor trench 156 and the two via holes 158 form an inductor pattern opening 154 of the inductor structure. In other words, the inductor structure 164 includes a spiral inductor filling in the inductor trench 156 and two via plugs filling in the via holes 158.

In other embodiments, one via hole 158 can be formed by the second etching process shown in FIG. 11, filled by the conductive material as shown in FIG. 14, and another via plug (not shown in the figures) can be formed above the inductor structure 164 after the inductor trench 156 is filled.

The method of the present invention can also applied to the inductor structures having different structures. Please refer to FIGS. 17-21. FIGS. 17-21 are schematic cross-sectional diagrams illustrating a method for forming an inductor structure according to a second preferred embodiment of the present invention.

Figure 17:
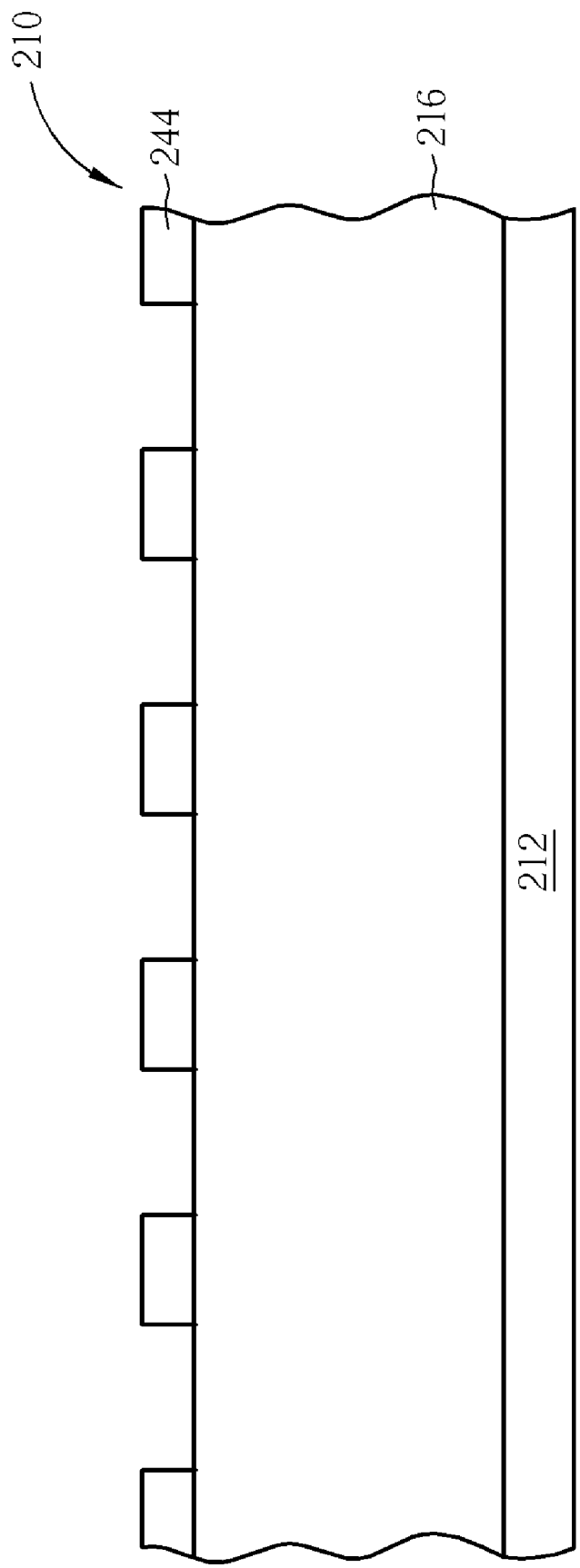
FIGS. 17-21 are schematic cross-sectional diagrams illustrating a method for forming an inductor structure according to a second preferred embodiment of the present invention.

As shown in FIG. 17, a semiconductor wafer 210 is provided first. The semiconductor wafer 210 includes a substrate 212, a dielectric layer 216 covering the substrate 212, and a patterned mask 244 positioned on the dielectric layer 216. The dielectric layer 216 can contain any kind of insulating materials, such as fluorinated silicate glass, carbon incorporating oxide, undoped silicate glass, phosphosilicate glass, or borophosposilicate glass. The patterned mask 244 defines an inductor trench pattern of the subsequent inductor structure.

It should be noted that the semiconductor wafer 210 can include an inner core circuit (not shown in the figures), which includes a plurality of transistor components, a plurality of resistance components, a plurality of interconnect structures, etc. The inner core circuit located in the substrate 212 can be electrically connected to the inductor structure and other components in the semiconductor wafer 210 so as to form portions of an integrated circuit. However, the detailed connection of the inner core circuit should depend on the product design, and is not described in detail here.

Figure 18:
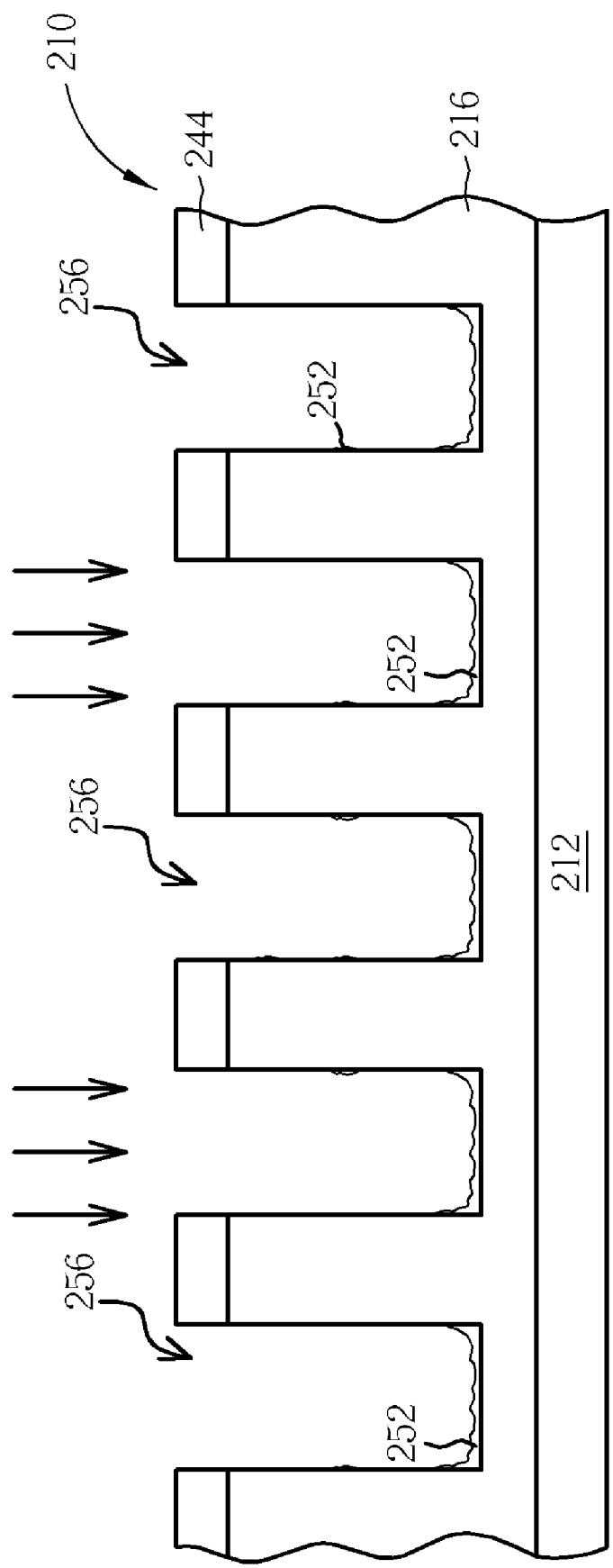

As shown in FIG. 18, a first etching process is next performed to remove a portion of the dielectric layer 216 to a predetermined depth by utilizing the patterned mask 244 as an etching mask so that an inductor trench 256 of the inductor structure is formed in the dielectric layer 216. The first etching process can be a plasma etching process containing oxygen gas, argon gas and fluorocarbon gas, such as octafluorocyclopentene. The inductor trench 256 has a spiral shape in top view of the semiconductor wafer 210 (it is well known by a person skilled in this art, so it not shown in the figures). During the first etching process, a polymer 252 is usually formed on the sidewall and on the bottom of the inductor trench 256. The polymer 252 may comprise high-molecule polymers with carbon, silicon, nitrogen, fluorine, titanium, or other impurities.

Figure 19:
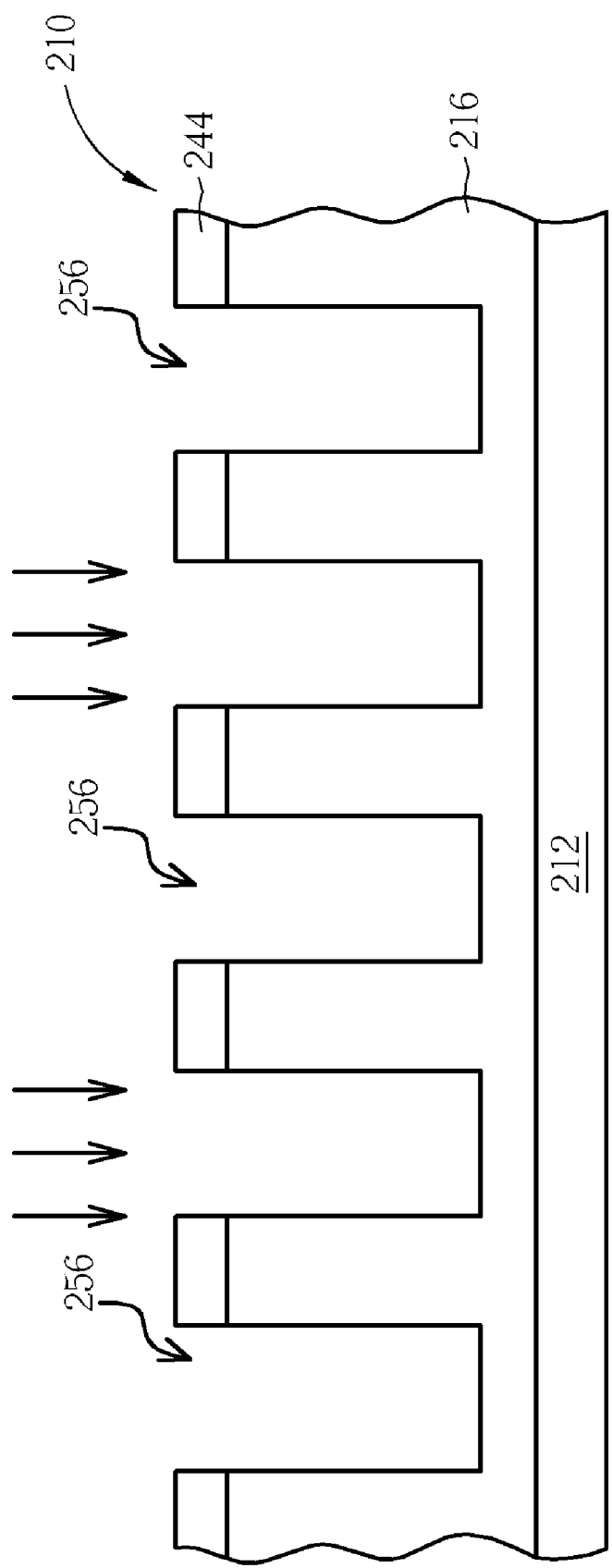

As shown in FIG. 19, a polymer-removing step is next carried out to remove the polymer 252 formed in the inductor trench 256. The first etching process and the polymer-removing step are both plasma etching processes performed in the same etch chamber. However, the reaction gases are changed. The polymer-removing step can include oxygen gas, argon gas and hydro-fluorocarbon gas, such as trifluoromenthane. By use of such etching gases composed of a mixture of argon gas, oxygen gas and trifluoromenthane gas, the polymer 252 is easily and inexpensively removed without hurting the inductor trench 256 and the semiconductor wafer 210.

Figure 20:
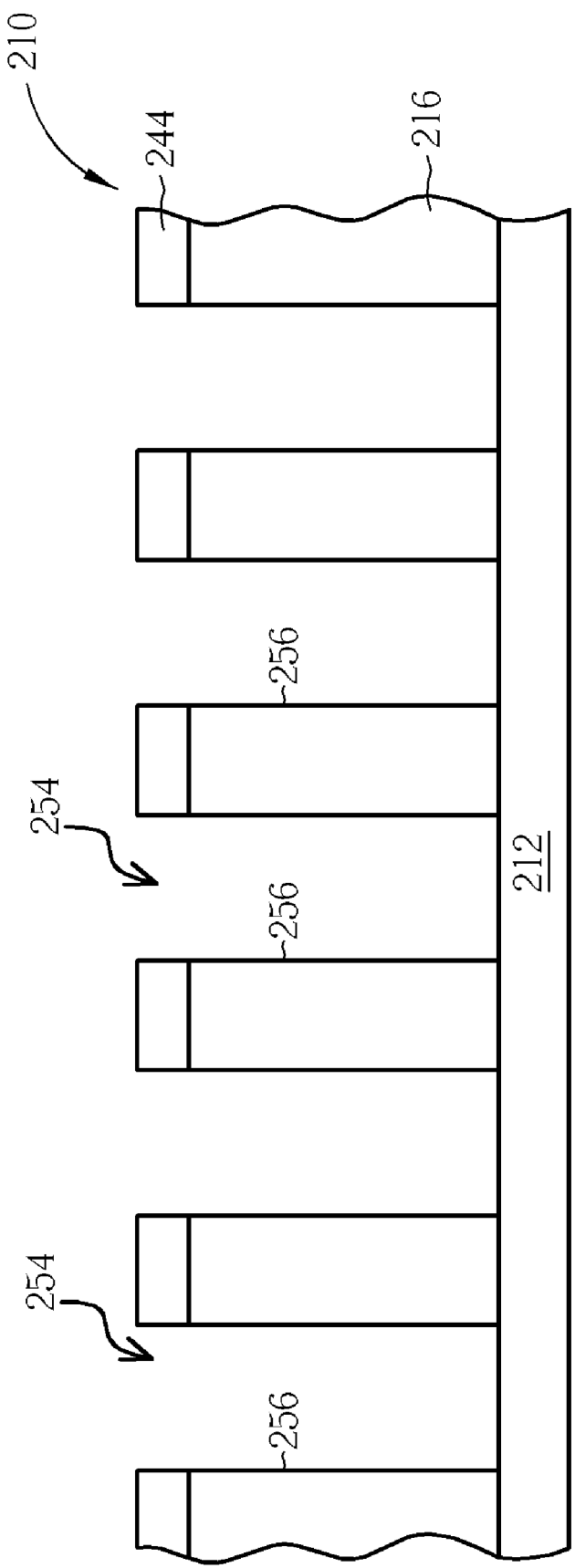

Afterward, as shown in FIG. 20, a second etching process is performed to remove a portion of the dielectric layer 216 until the surface of the substrate 212 is exposed so as to form an inductor pattern opening 254 of the inductor structure in the dielectric layer 216. The second etching process can also be a plasma etching process performed in the same etch chamber with the first etching process or the polymer-removing step. The second etching process can contain oxygen gas, argon gas and fluorocarbon gas, such as octafluorocyclopentene.

Figure 21:
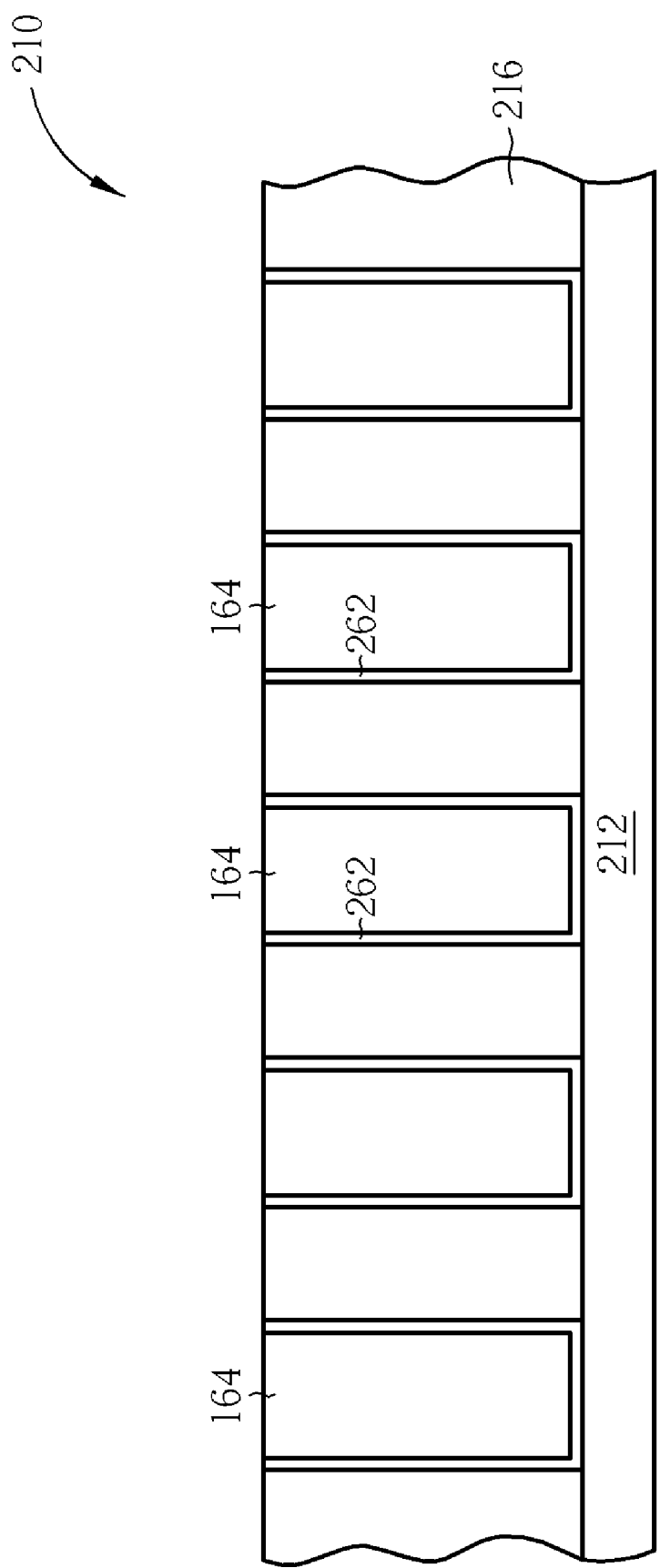

As shown in FIG. 21, a barrier layer 262 can be thereafter deposited on the surface of the inductor pattern opening 254. Afterward, a deposition process is performed to form a thin seed layer (not shown in the figures) on the surface of the barrier layer 262. Next, a conductive material is thereafter formed to fill the inductor pattern opening 254. The filling conductive material in the inductor pattern opening 254 becomes an inductor structure 164, and the terminals of the inductor structure 164 are electrically connected to the interconnect structure located in the substrate 212. It should be noted that the terminals of the inductor structure 164 not only can be electrically connected to the interconnect structure located in the substrate 212, but also can be electrically connected to a interconnect structure formed in the subsequent layer, such as a layer above the dielectric layer 216.

Figure 22:
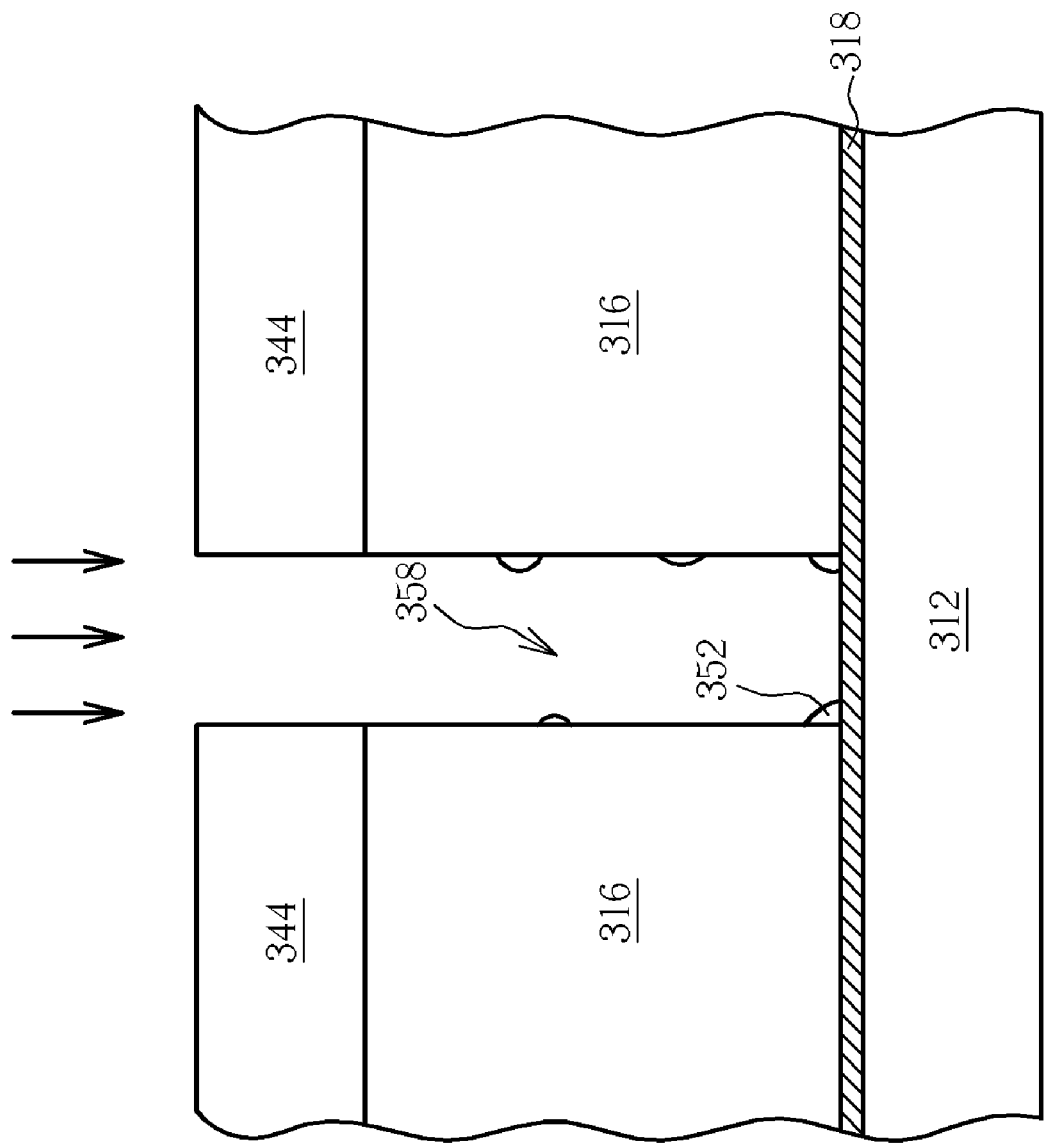
FIGS. 22-25 are schematic diagrams of the method for fabricating a dual damascene structure according to a third embodiment of the present invention.

The present invention can also be applied to the dual damascene structures. Referring to FIGS. 22-25, FIGS. 22-25 are schematic diagrams of the method for fabricating a dual damascene structure according to a third embodiment of the present invention. The method is a method for fabricating a dual damascene structure by a via-first process. First, as shown in FIG. 22, a semiconductor wafer 310 including a substrate 312 is provided. The semiconductor wafer 310 includes an etching stop layer 318 positioned on the substrate 312, and a dielectric layer 316 thereon, where the etching stop layer 318 may comprises silicon nitride, silicon carbide, or nitrogen incorporating silicon carbide layer. The dielectric layer 316 can contain insulating materials, such as low-k dielectric layer including Si-containing layer including fluorinated silicate glass, or carbon incorporating oxide. A cap mask layer (not shown) including silicon oxy-nitride, silicon nitride, silicon oxide, or conductive layer such as titanium nitride or their combination is positioned on the dielectric layer 316 to prevent the dielectric layer 316 from suffering k value degradation during further patterning process. Thereafter, a first patterned mask 344 is coated above the cap mask layer and the dielectric layer 316. The first patterned mask 344 has an opening so as to define a via hole pattern.

Afterward, a first etching process is performed for etching the dielectric layer 316 through the opening of the first patterned mask 344. Accordingly, a via hole 358 is formed in the dielectric layer 316. At this time, a polymer 352 usually remains on the sidewall surface and bottom corner of the via hole 358. Normally, the polymer 352 includes high polymers containing carbon, nitrogen, silicon, fluorine, and titanium.

Figure 23:
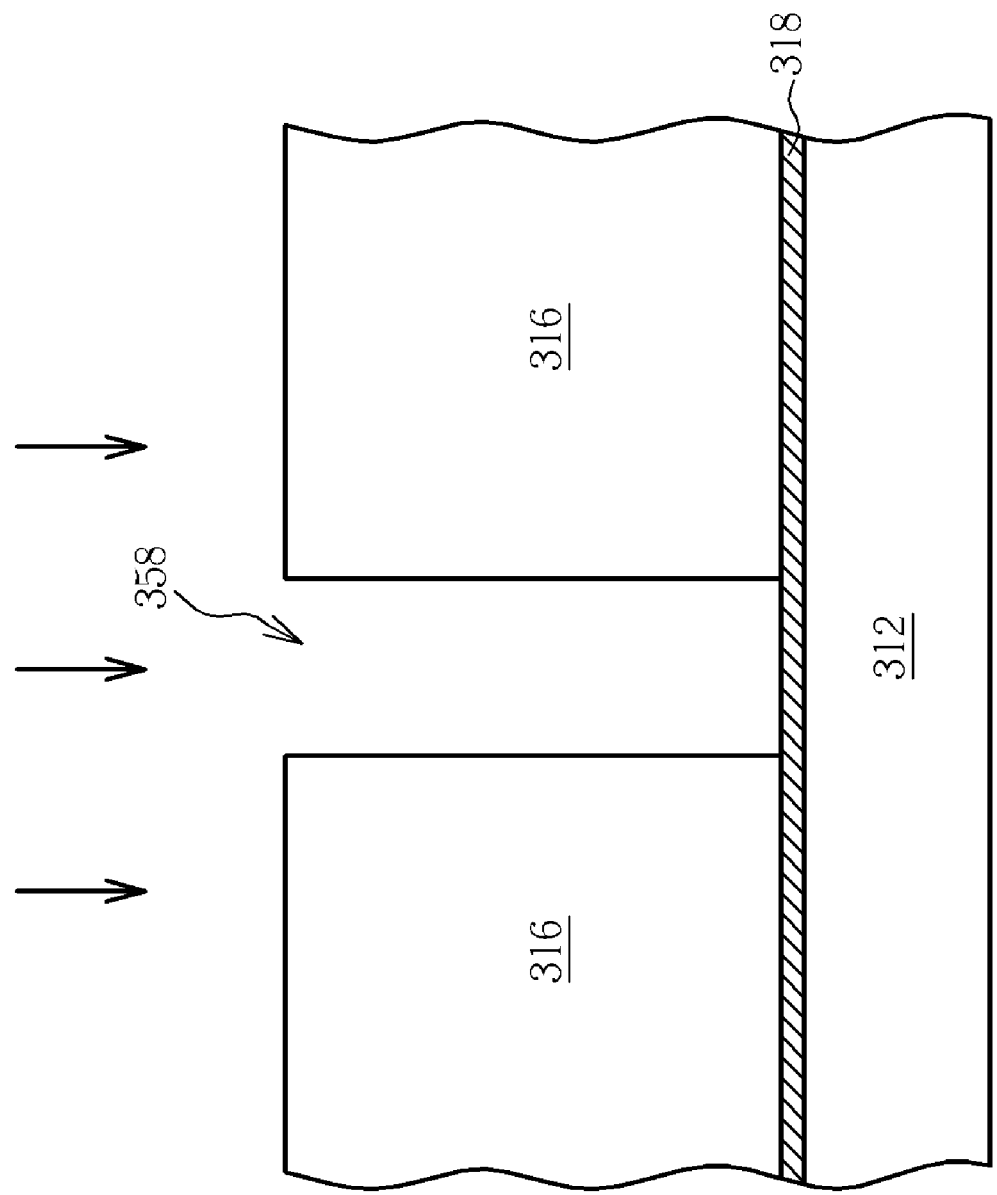

As shown in FIG. 23, a polymer-removing step is next carried out to remove the polymer 352 formed in the via hole 358. The first etching process step and the polymer-removing step are both plasma etching processes performed in the same etch chamber, and the reaction gases are changed. The polymer-removing step can include oxygen gas, argon gas and hydro-fluorocarbon gas, such as trifluoromenthane. By use of the etching gas composed of a mixture of argon gas, oxygen gas and trifluoromenthane gas, the polymer 352 is easily and inexpensively removed without hurting the via hole 358 and the semiconductor wafer 310.

Figure 24:
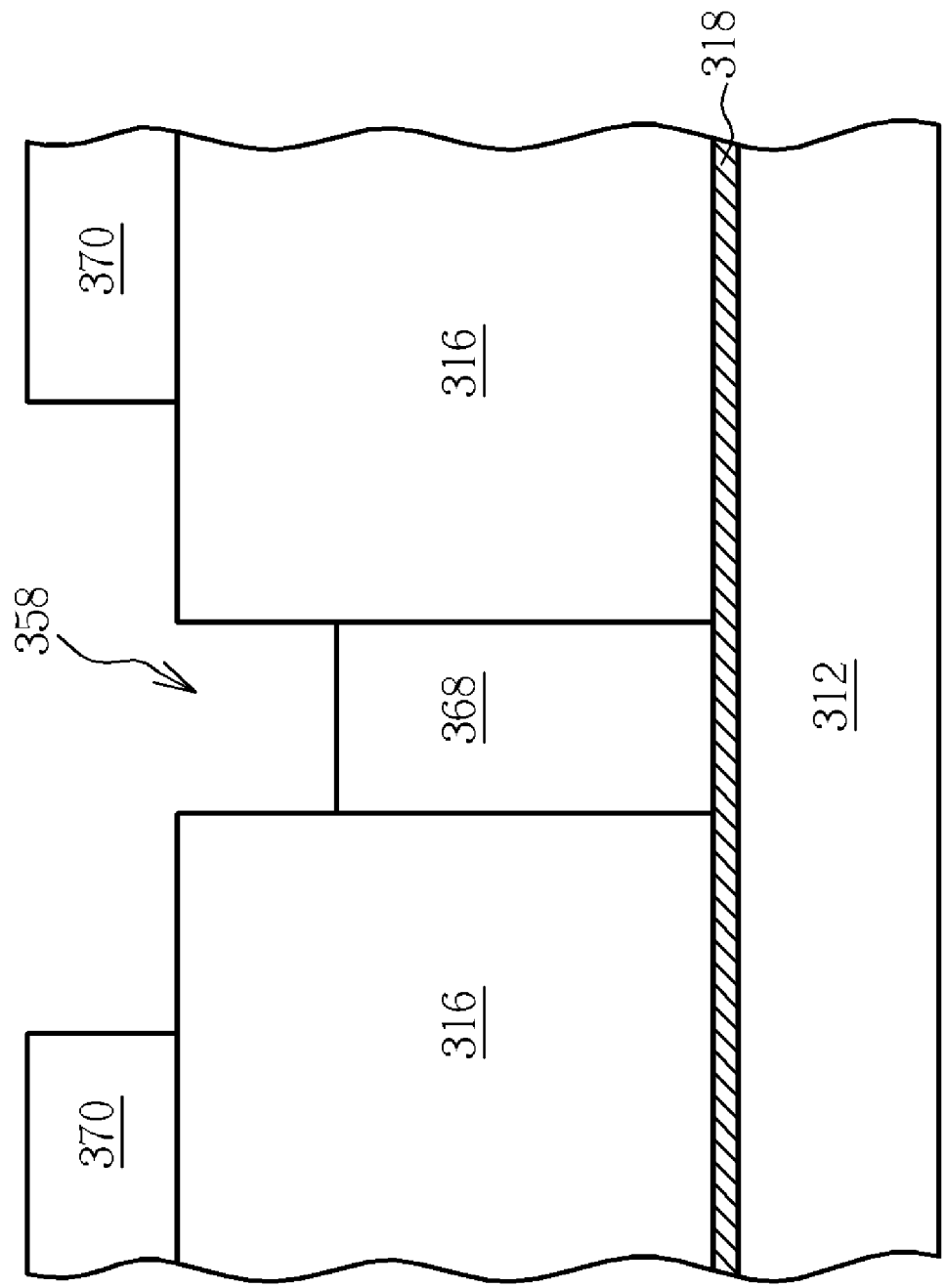

As shown in FIG. 24, a gap-fill polymer (GFP) layer 368 is coated on the substrate 312 and removing the GFP on top of the dielectric layer 316, so that only the via hole 358 is filled with the GFP layer 368. Conventionally, the GFP layer 368 is composed with I-Line photoresist (applied to 365 nm of wavelength). The coating process of the GFP layer 368 is similar to usual photoresist coating processes, and optional post-baking step may be carried out if desired. Therefore, the GFP layer 368 is formed to have a predetermined depth. Afterward, a second patterned mask 370 is coated on the substrate 312 so that a portion of the dielectric layer 316 not covered by the GFP materials can be coated with the second patterned mask 370. The second patterned mask 370 has an opening so as to define a trench pattern.

Figure 25:
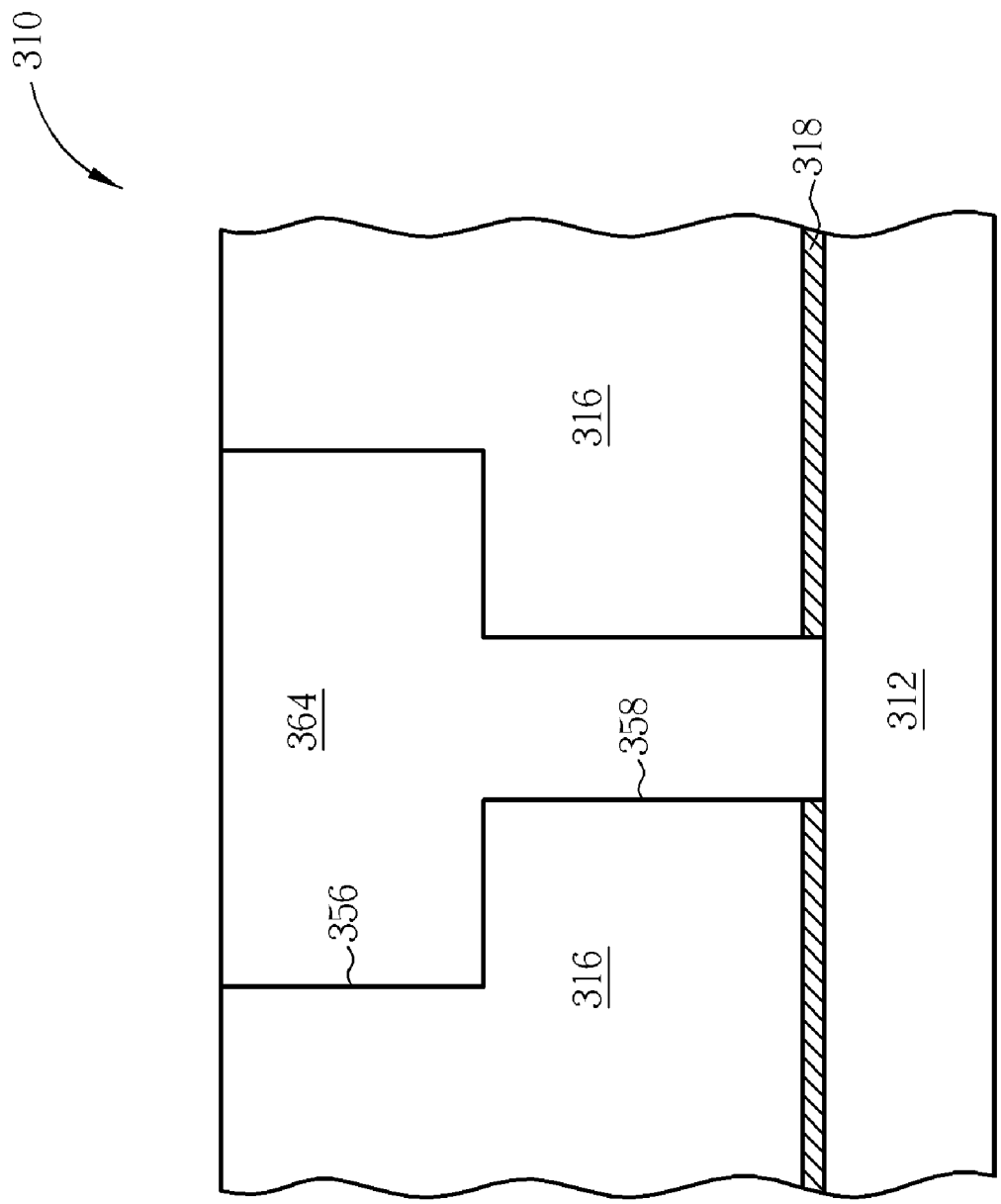

As shown in FIG. 25, a second etching process is carried out to etch the dielectric layer 316 to a predetermined depth, through the opening of the second patterned mask 370. The second etching process can also be a plasma etching process performed in the same etch chamber with the first etching process or the polymer-removing step. Accordingly, a trench 356 is formed in the upper portion of the dielectric layer 316. Sequentially, the second patterned mask 370 and the GFP layer 368 in the via hole 358 are removed so as to expose the etching stop layer 318. The exposed etching stop layer 318 is removed with a third etching process. It should be noted that a barrier layer (not shown) can be deposited on the surface of the trench 356 and the via hole 358 before the conductive material is formed. Furthermore, a chemical vapor deposition (CVD) process or a sputtering process may be performed to form a conductive material in the trench 356 and the via hole 358, where the conductive material may comprise copper, aluminum, or other metal materials. A polishing process may be carried out if desired. Therefore, the fabrication of the dual damascene structure 364 is finished.

Typically, the dual damascene process includes trench-first, via-first, partial-via-first, and self-aligned processes, so it should be understood by a person skilled in this art that the present invention could be applied to a via-first process in the third embodiment, a trench-first process in the fourth embodiment, a partial-via-first process in the fifth embodiment, and a self-aligned process as well.

Figure 26:
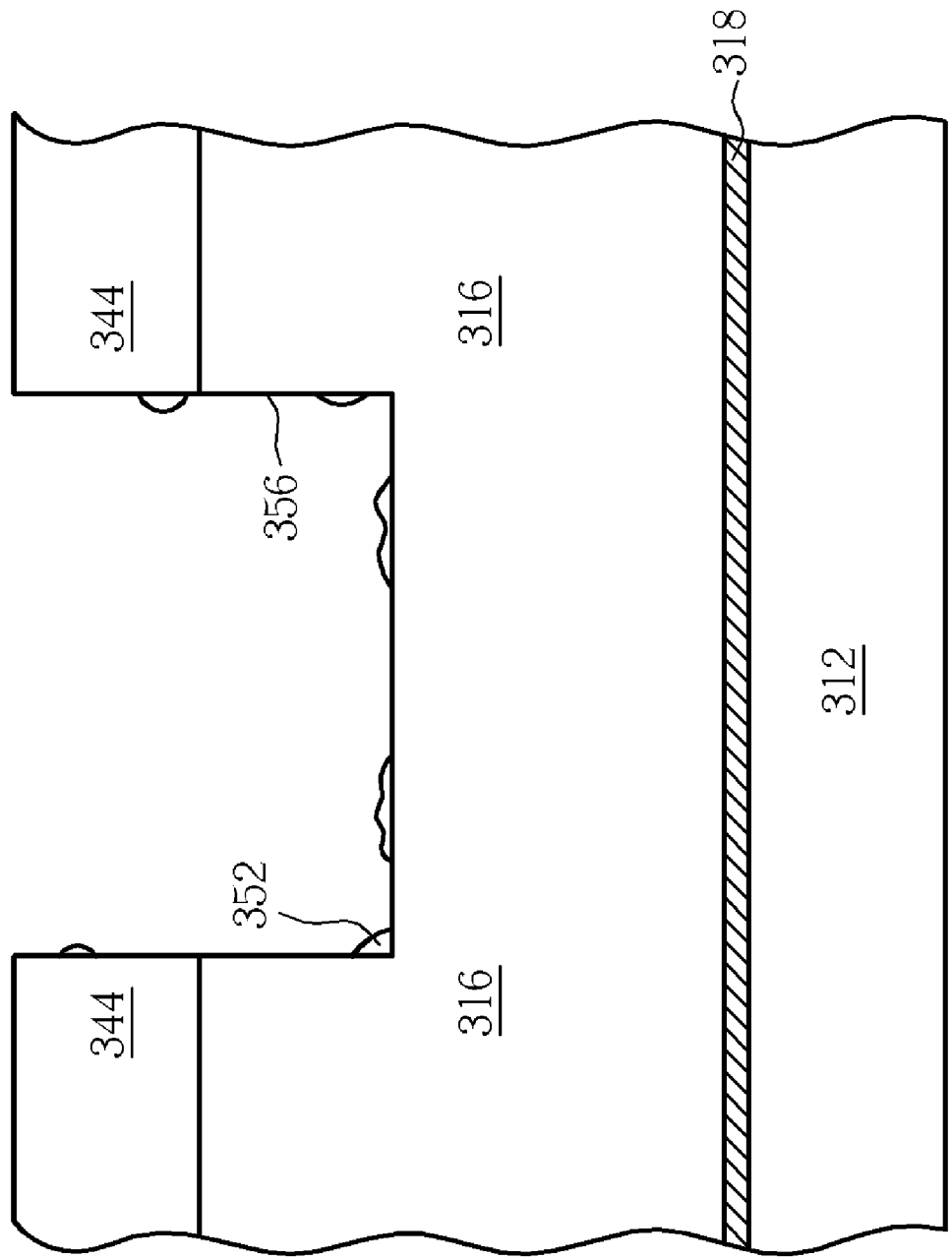
FIGS. 26-28 are schematic diagrams of the method for fabricating a dual damascene structure according to a fourth embodiment of the present invention.
Figure 27:
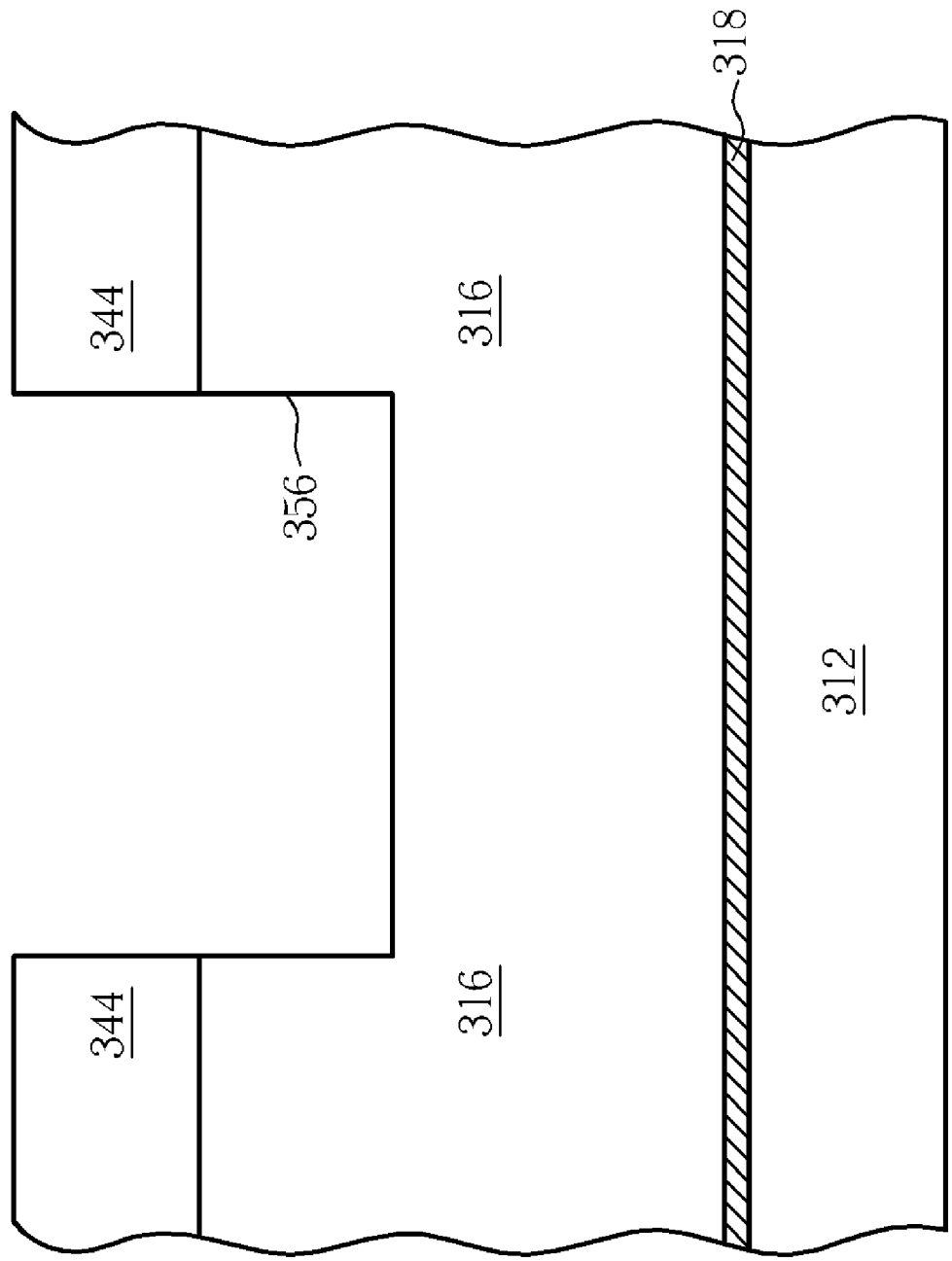
Figure 28:
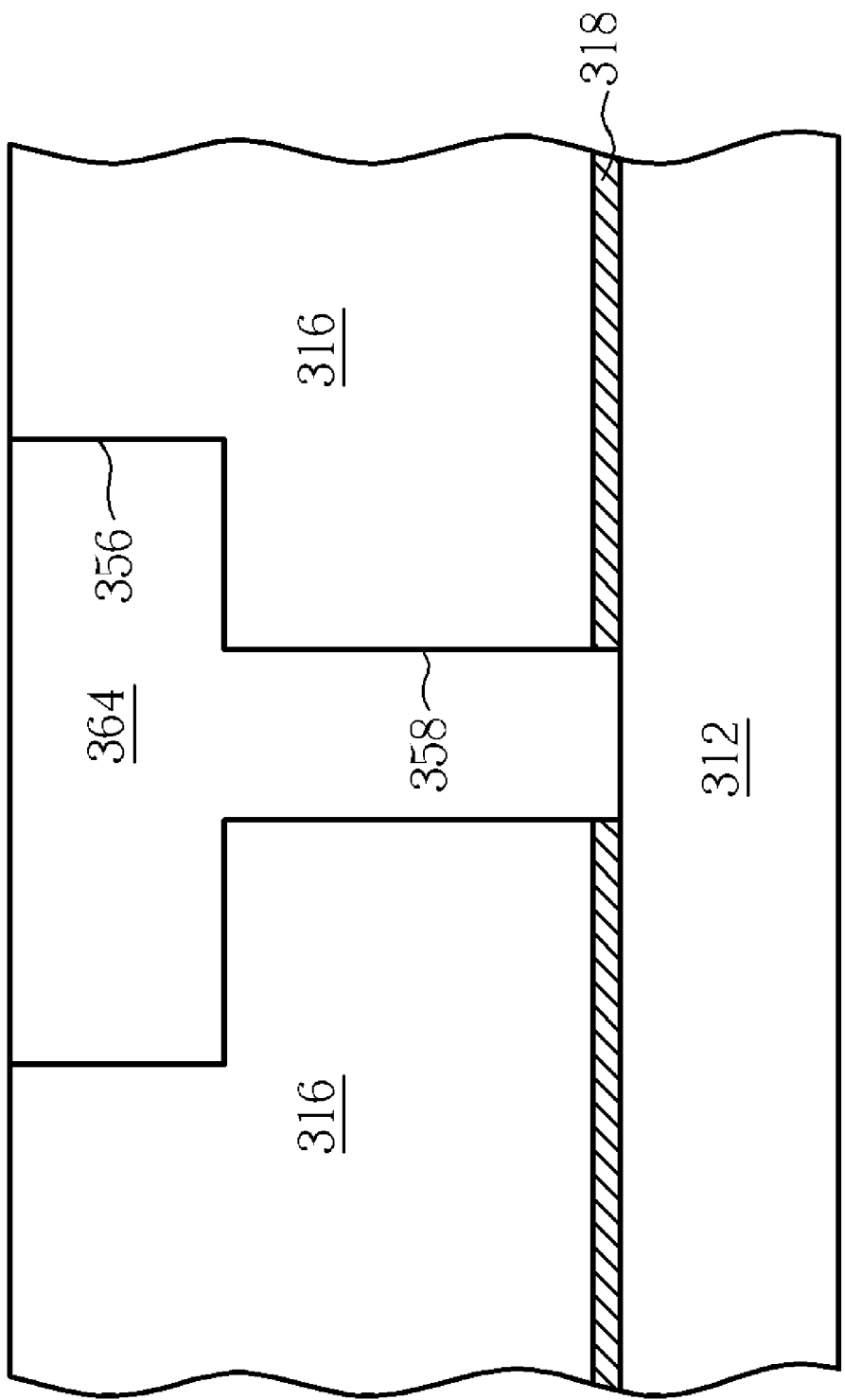

Please refer to FIGS. 26-28. FIGS. 26-28 are schematic diagrams of the method for fabricating a dual damascene structure according to a fourth embodiment of the present invention, where like number numerals designate similar or the same parts, regions or elements. When the present invention is applied to a trench-first process, the first etching process forms a first opening as a trench 356 of the dual damascene structure, as shown in FIG. 26. Subsequently, as shown in FIG. 27, the polymer-removing step strips the polymer 352 positioned in the trench 356. As shown in FIG. 28, the second etching process thereafter forms a second opening as a via hole 358 positioned at the bottom of the first opening 356 utilizing another patterned mask. Next, the trench 356 and the via hole 358 are filled with at least a conductive material, and the fabrication of the dual damascene structure 364 is finished.

Figure 29:
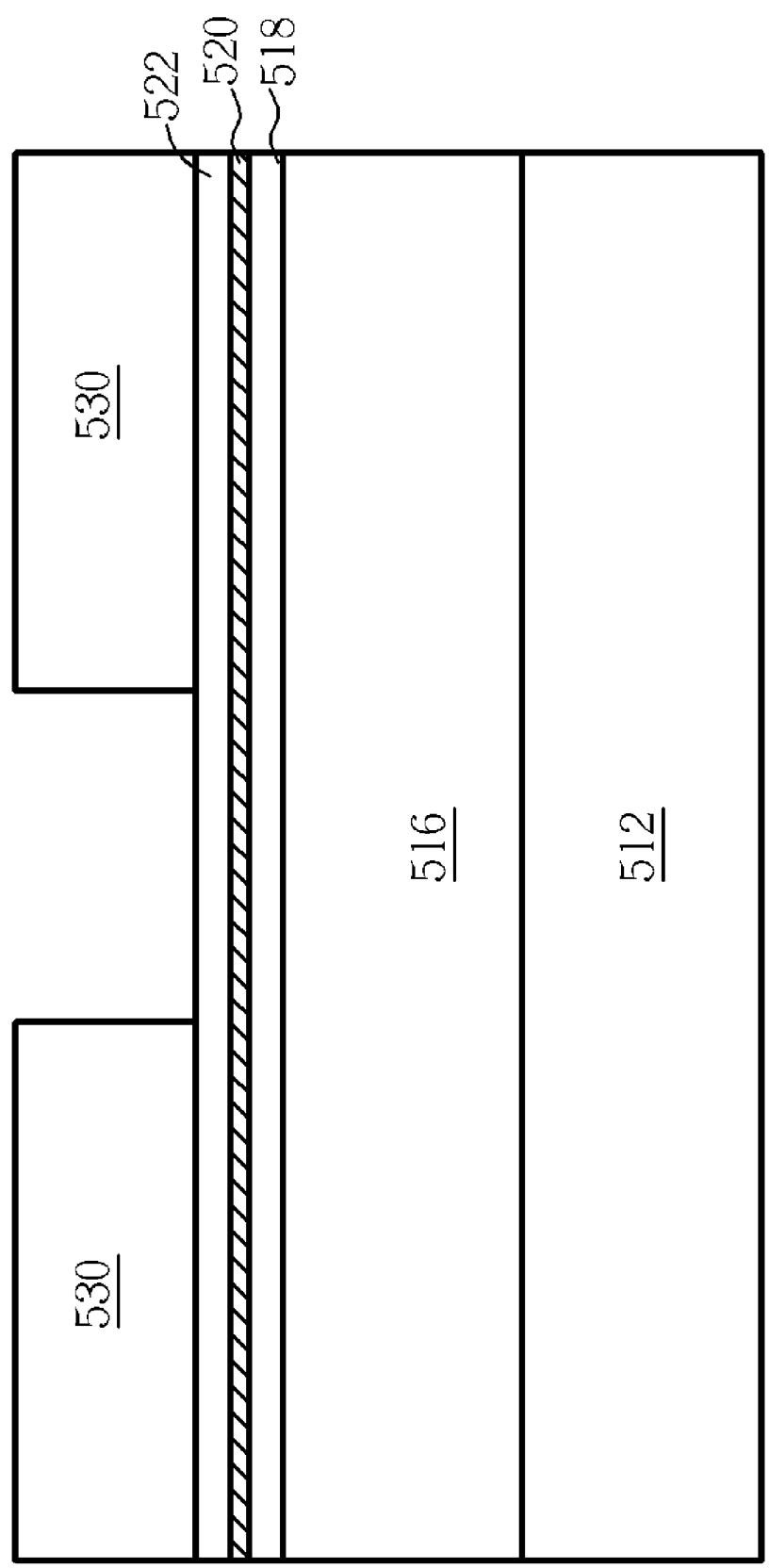
FIGS. 29-34 are schematic diagrams of the method for fabricating a dual damascene structure according to a fifth embodiment of the present invention.

Please refer to FIGS. 29-34. FIGS. 29-34 are schematic diagrams of the method for fabricating a dual damascene structure according to a fifth embodiment of the present invention. As shown in FIG. 29, a substrate 512 is first provided. A dielectric layer 516 with low-k material, a cap layer 518, a hard mask layer 520 and a bottom anti-reflective coating (BARC) layer 522 are sequentially deposited on the substrate 512. A patterned mask 530 having a trench opening therein is formed on the BARC layer 522.

Figure 30:
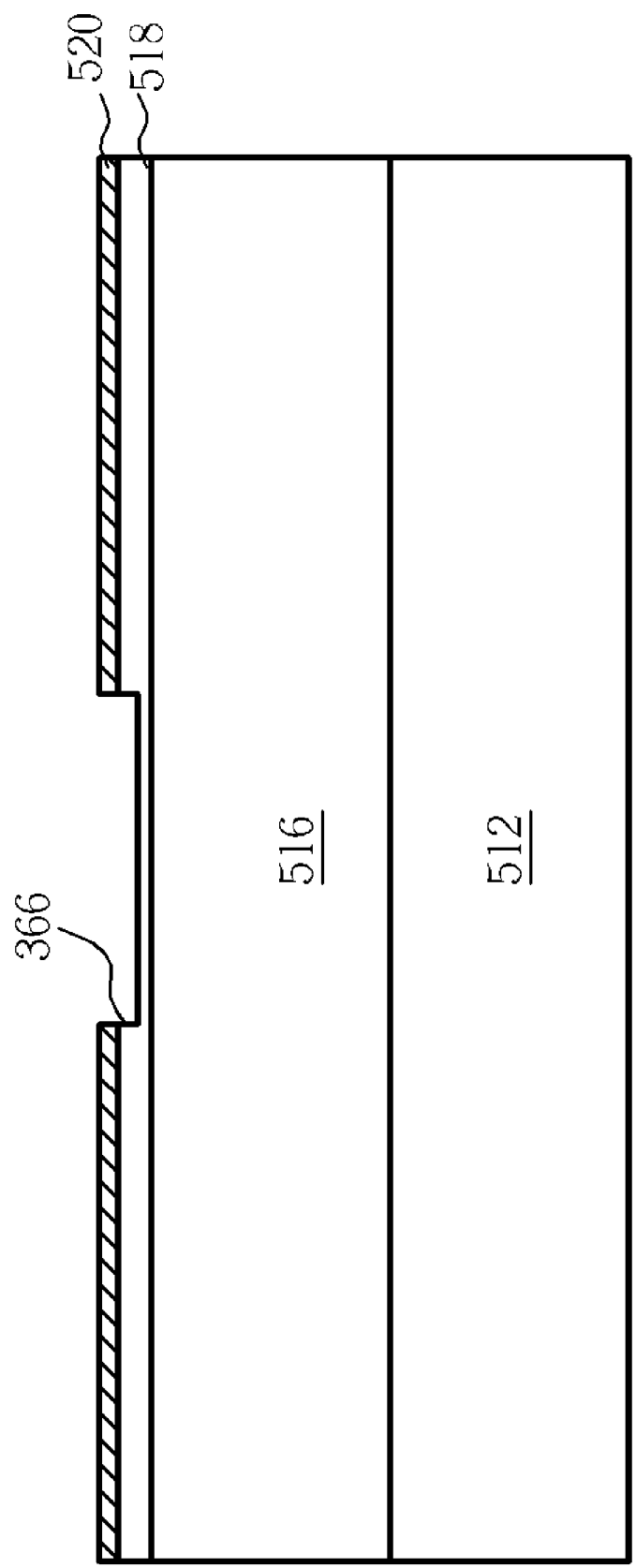

Subsequently, as shown in FIG. 30, a dry etching process is carried out. A trench recess 366 is etched into the hard mask layer 520 and the cap layer 518 through the trench opening. The dry etching stops on the cap layer 518. The patterned mask 530 and BARC layer 522 are then stripped off.

Figure 31:
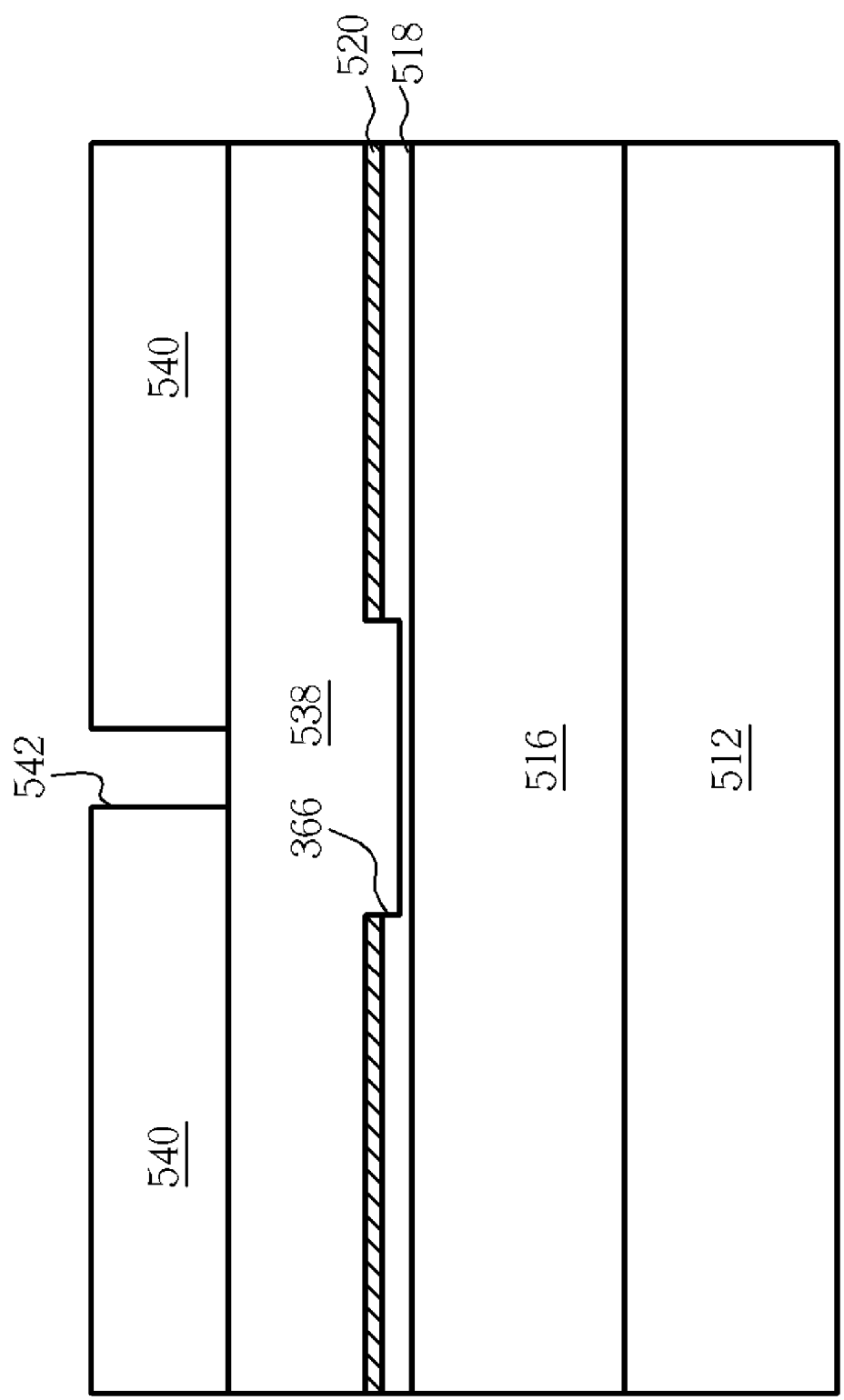

As shown in FIG. 31, another BARC layer 538 is coated over the substrate 512 and fills the trench recess 366. A patterned mask 540 is then formed on the BARC layer 538. The patterned mask 540 has a via opening 542 patterned by using lithographic processes. The via opening 542 is situated directly above the trench recess 366.

Figure 32:
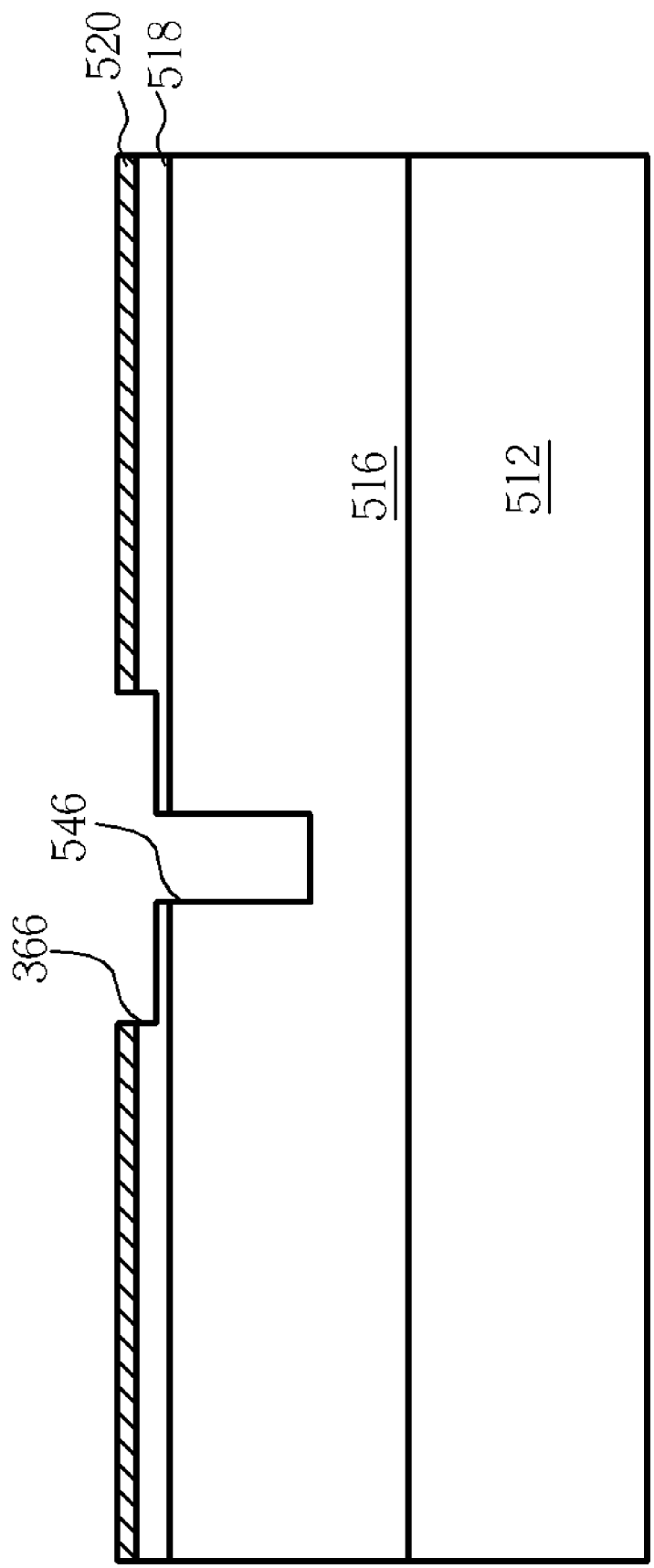
Figure 33:
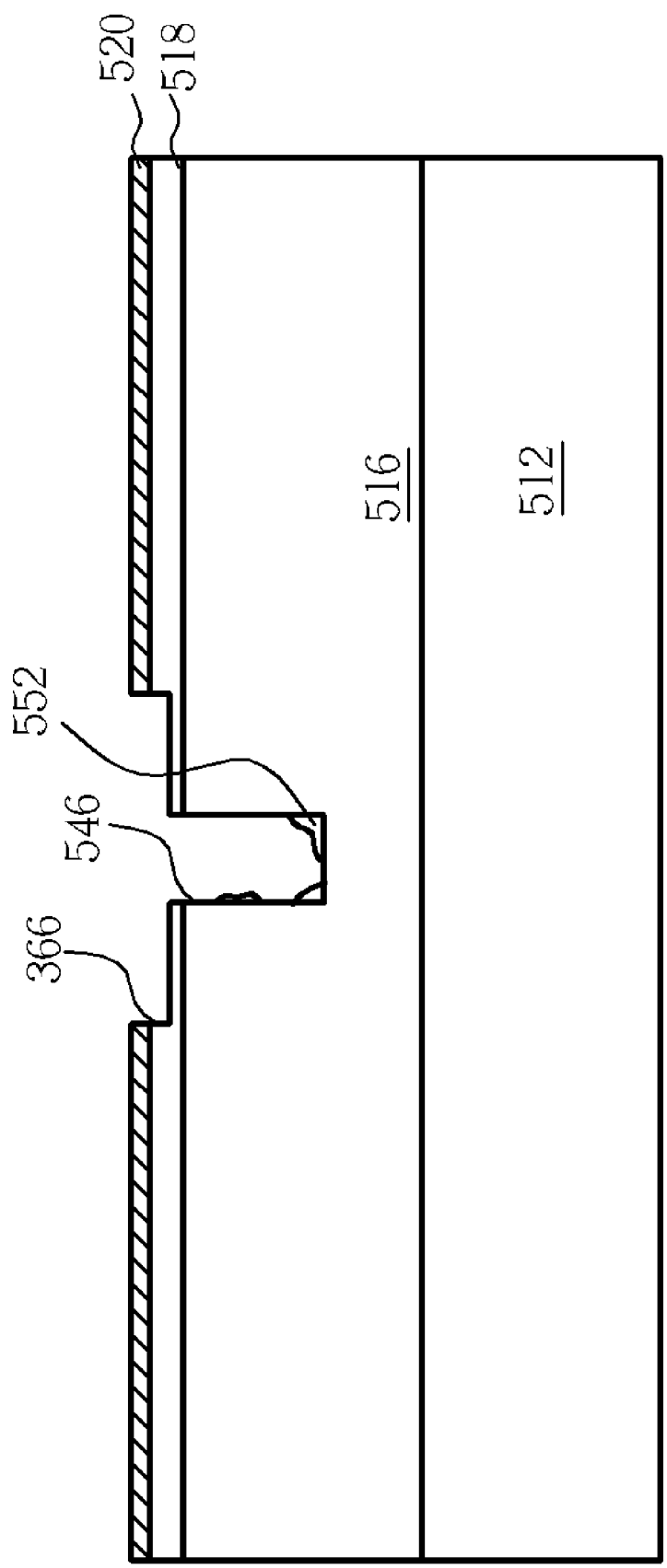

As shown in FIG. 32, using the patterned mask 540 as an etching hard mask, the BARC layer 538, the cap layer 518, and the dielectric layer 516 are etched through the via opening 542, thereby forming a partial via feature 546 in an upper portion of the dielectric layer 516. The patterned mask 540 and the BARC layer 538 are stripped off by using oxygen plasma. During those etching processes, a polymer 552 is usually formed in the partial via feature 546. The polymer 552 may comprise high-molecule polymers with carbon, silicon, nitrogen, fluorine, titanium, or other impurities. As shown in FIG. 33, a polymer-removing step is next carried out to remove the polymer 552 formed in the partial via feature 546, where the polymer-removing step can be a plasma etching process.

Figure 34:
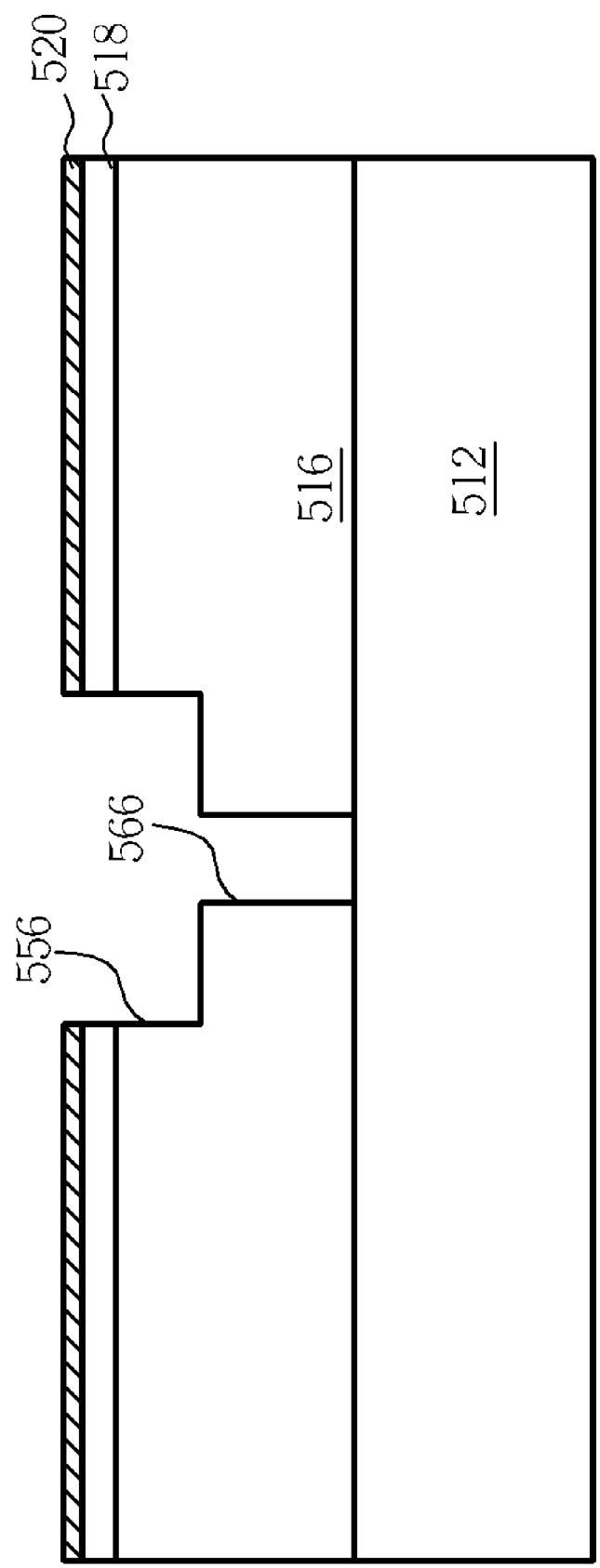

As shown in FIG. 34, using the hard mask layer 520 as an etching hard mask, a dry etching is performed to etch away the cap layer 518 and the dielectric layer 516 through the trench recess 366 and the partial via 546, thereby forming a trench opening 556 and a via opening 566. Thereafter, the trench opening 556 and the via opening 566 can be filled with at least a conductive material, and the fabrication of the dual damascene structure (not shown) is finished.

It is shown that the polymer is easily formed on the surface of the inductor pattern opening during the etching process of forming the inductor pattern opening. The polymer causes obstructions and retardations that elongate the etching process of forming the inductor pattern opening. Especially, when the inductor pattern opening is designed to have a high aspect ratio, the polymer seriously covers the surface of the inductor pattern opening, and retards the etching process from forming the opening. Furthermore, the retardations will make the opening have a rough and uneven surface, and even deforms the opening. By means of changing the reaction gas in the etching chamber, the polymer formed in the opening is easily and inexpensively removed without hurting the opening. According to the measurement of the fabricating processes, the present invention can save 15 percent (%) to 20% etching time from the prior art.

Since the present invention can easily and inexpensively remove the polymer formed in the openings having high aspect ratios, the method of the present invention can be applied to the methods of forming any contact plug, via plug, trench, or high aspect ratio opening, and more particularly, the present invention is proper for the methods of forming an opening having an aspect ratio larger than three. Normally, the present invention is usually preferred for the methods of forming an opening in a dielectric layer having a thickness larger than 10000 angstroms.

Briefly speaking, the present invention can save the process time and process cost by means of changing the reaction gas in the etching chamber, improve the opening structure, and simplify the process of fabricating an opening.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a dual damascene structure, comprising:

providing a substrate, the substrate comprising a dielectric layer, wherein the dielectric layer comprises an etching stop layer therein, and the etching stop layer has at least an opening defining a via hole pattern;

performing a first etching process on the dielectric layer until exposing the etching stop layer so as to form at least a first opening in the dielectric layer, the first etching process also forming a polymer in the first opening, wherein the first opening in the dielectric layer is an inductor trench overlapping the opening of the etching stop layer, and wherein the first etching process does not etch through the etching stop layer;

performing at least a polymer-removing step, wherein the polymer-removing step comprises using hydro-fluoro-carbon to remove the polymer;

performing a second etching process on the dielectric layer after the polymer-removing step so as to form a second opening within the first opening and to expose a barrier layer that is positioned at a bottom of the second opening, and the second opening being positioned at a bottom of the first opening, wherein the second opening in the dielectric layer is a via hole;

performing a third etching process after the second etching process to remove the exposed barrier layer at the bottom of the second opening; and filling the first opening and the second opening with a conductive material so as to form the dual damascene structure, wherein the dual damascene structure forms an inductor structure.

2. The method of claim 1, wherein the first etching process, the polymer-removing step and the second etching process are all performed in an etch chamber.

3. The method of claim 1, wherein the first etching process, the polymer-removing step and the second etching process are all plasma etching processes.

4. The method of claim 1, wherein the first etching process comprises using oxygen, argon and fluorocarbon.

5. The method of claim 1, wherein the second etching process comprises using oxygen, argon and fluorocarbon.

6. The method of claim 1, wherein the polymer-removing step further comprises using oxygen and argon.

7. The method of claim 1, wherein the dielectric layer comprises fluorinated silicate glass.

8. The method of claim 1, wherein the dielectric layer comprises carbon doped oxide.

9. The method of claim 1, wherein the etching stop layer comprises silicon oxynitride.

10. The method of claim 1, wherein the substrate comprises an interconnect structure, and the interconnect structure is electrically connected to the inductor structure.

11. The method of claim 1, wherein the inductor trench comprises a spiral layout pattern.

12. The method of claim 1, wherein the substrate further comprises a patterned mask positioned on the dielectric layer, the patterned mask is utilized as an etching mask in the first etching process, the first opening in the dielectric layer is an inductor trench, the first and second openings are an inductor pattern opening, and the dual damascene structure forms an inductor structure.

13. The method of claim 1, wherein the first etching process and the polymer-removing step repeat periodically before the second etching process is performed.

14. The method of claim 12, wherein the inductor pattern opening has an aspect ratio larger than three.

* * * * *